(12) United States Patent
Inubushi et al.

(10) Patent No.: US 10,453,598 B2
(45) Date of Patent: Oct. 22, 2019

(54) MAGNETORESISTIVE EFFECT ELEMENT, MAGNETIC HEAD, SENSOR, HIGH FREQUENCY FILTER, AND OSCILLATION ELEMENT

(71) Applicant: TDK CORPORATION, Tokyo (JP)

(72) Inventors: Kazuumi Inubushi, Tokyo (JP); Katsuyuki Nakada, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/020,373

(22) Filed: Jun. 27, 2018

(65) Prior Publication Data

US 2019/0006074 A1      Jan. 3, 2019

(30) Foreign Application Priority Data

Jun. 29, 2017  (JP) .................................. 2017-127266
Oct. 11, 2017  (JP) .................................. 2017-197885

(51) Int. Cl.
*G11B 5/39*      (2006.01)
*H01F 10/32*    (2006.01)
(Continued)

(52) U.S. Cl.
CPC ......... *H01F 10/3259* (2013.01); *G01R 33/09* (2013.01); *G01R 33/093* (2013.01); *G01R 33/098* (2013.01); *G11B 5/3906* (2013.01); *G11B 5/3909* (2013.01); *H01F 10/329* (2013.01); *H01L 43/02* (2013.01); *H01L 43/08* (2013.01); *H01L 43/10* (2013.01);
(Continued)

(58) Field of Classification Search
None
See application file for complete search history.

(56) References Cited

U.S. PATENT DOCUMENTS 9,643,385 B1 *   5/2017   Butler ..................... B32B 15/01
10,205,091 B2 *  2/2019   Chen ....................... H01F 10/16
(Continued)

FOREIGN PATENT DOCUMENTS

JP      2012-190914 A    10/2012
JP         6137577 B2     5/2017

OTHER PUBLICATIONS

Hari S. Goripati et al., "Bi-quadratic interlayer exchange coupling in Co2MnSi/Ag/Co2MnSi pseudo spin-valve", Journal of Applied Physics, vol. 110, pp. 123914-1-123914-7, 2011.
(Continued)

*Primary Examiner* — William J Klimowicz
(74) *Attorney, Agent, or Firm* — Oliff PLC

(57) ABSTRACT

There is provided a magnetoresistive effect element having improved magnetoresistive effect. A magnetoresistive effect element MR includes a first ferromagnetic layer 4 as a fixed magnetization layer, a second ferromagnetic layer 6 as a free magnetization layer, and a nonmagnetic spacer layer 5 provided between the first ferromagnetic layer 4 and the second ferromagnetic layer 6. The nonmagnetic spacer layer 5 includes at least one of a first insertion layer 5A provided under the nonmagnetic spacer layer 5 and a second insertion layer 5C provided over the nonmagnetic spacer layer 5. The first insertion layer 5A and the second insertion layer 5C are made of $Fe_2TiSi$.

10 Claims, 13 Drawing Sheets

(FIRST EMBODIMENT)

(51) Int. Cl.
*H01L 43/02* (2006.01)
*H03H 11/04* (2006.01)
*G01R 33/09* (2006.01)
*H03B 15/00* (2006.01)
*H01L 43/10* (2006.01)
*H01L 43/08* (2006.01)
*H03H 2/00* (2006.01)

(52) U.S. Cl.
CPC ........... *H03B 15/006* (2013.01); *H03H 11/04* (2013.01); *G11B 2005/3996* (2013.01); *H03H 2/00* (2013.01)

(56) References Cited

U.S. PATENT DOCUMENTS

| | | |
|---|---|---|
| 2016/0019917 A1 | 1/2016 | Du et al. |
| 2017/0207016 A1* | 7/2017 | Butler ................... B32B 15/01 |
| 2018/0254409 A1* | 9/2018 | Nakada ............... H01F 10/1936 |

OTHER PUBLICATIONS

T. Furubayashi et al., "Structure and transport properties of current-perpendicular-to-plane spin valves using Co2FeAl0.5Si0.5 and Co2MnSi Heusler alloy electrodes", Journal of Applied Physics, vol. 107, pp. 113917-1-113917-7, 2010.

* cited by examiner (FIRST EMBODIMENT)

(SECOND EMBODIMENT)

Fig.8

| | FIRST FERROMAGNETIC LAYER 4 | FIRST INSERTION LAYER 5A | | NONMAGNETIC MATERIAL 5B | SECOND INSERTION LAYER 5C | | SECOND FERROMAGNETIC LAYER 6 | MR RATIO (%) | LATTICE MISMATCH RATIO | | | EVALUATION |
|---|---|---|---|---|---|---|---|---|---|---|---|---|
| | MATERIAL | MATERIAL | THICKNESS (nm) | MATERIAL | MATERIAL | THICKNESS (nm) | MATERIAL | | R1: FIRST (SECOND) FERROMAGNETIC LAYER 4(6) / NONMAGNETIC MATERIAL 5B | P2: FIRST (SECOND) FERROMAGNETIC LAYER 4(6) / FIRST (SECOND) INSERTION LAYER 5A(5C) | R2: FIRST (SECOND) INSERTION LAYER 5A(5C) / NONMAGNETIC MATERIAL 5B | |
| COMPARATIVE EXAMPLE 1 | Fe | NONE | – | Ag | NONE | – | Fe | 1.6 | 1.1 | – | – | – |
| EXAMPLE 1 | " | Fe2TiSi | 1 | " | Fe2TiSi | 1 | " | 2.8 | 1.1 | 0 | 1.2 | B |
| | " | " | 3 | " | " | 3 | " | 2.7 | 1.1 | 0 | 1.2 | B |
| | " | " | 5 | " | " | 5 | " | 1.9 | 1.1 | 0 | 1.2 | B |
| COMPARATIVE EXAMPLE 2 | Co2MnSi | NONE | – | Ag | NONE | – | Co2MnSi | 8.8 | 3.4 | – | – | – |
| EXAMPLE 2 | " | Fe2TiSi | 1 | " | Fe2TiSi | 1 | " | 19.1 | 3.4 | 2.2 | 1.2 | A |
| | " | " | " | Au | " | " | " | 17.4 | 2.9 | 2.2 | 0.6 | A |
| | " | " | " | Cu | " | " | " | 11.4 | -8.8 | 2.2 | -10.8 | B |
| | " | " | " | Cr | " | " | " | 15.5 | 2.9 | 2.2 | 0.6 | A |
| | " | " | " | Al | " | " | " | 13.5 | 2.2 | 2.2 | -0.1 | B |
| | " | " | " | Pt | " | " | " | 10.7 | -1 | 2.2 | -3.2 | B |
| | " | " | " | V | " | " | " | 10.4 | 8.1 | 2.2 | 5.7 | A |
| | " | " | " | W | " | " | " | 10.1 | 12.6 | 2.2 | 10.1 | A |
| COMPARATIVE EXAMPLE 3 | " | NONE | – | MgO | NONE | – | " | 36 | 6.3 | – | – | – |
| EXAMPLE 3 | " | Fe2TiSi | 1 | " | Fe2TiSi | 1 | " | 73 | 6.3 | 2.2 | 3.9 | A |
| | " | " | " | TiO2 | " | " | " | 52 | 5.3 | 2.2 | 3 | A |
| | " | " | " | HfO2 | " | " | " | 38 | -8.7 | 2.2 | -10.7 | B |
| EXAMPLE 4 | " | " | " | MgAl2O4 | " | " | " | 74 | 2 | 2.2 | -0.3 | B |
| | " | " | " | ZnAl2O4 | " | " | " | 68 | 1.7 | 2.2 | -0.5 | B |
| | " | " | " | γ – Al2O3 | " | " | " | 39 | -0.2 | 2.2 | -2.4 | B |
| | " | " | " | MgGa2O4 | " | " | " | 55 | 4.5 | 2.2 | 2.2 | A |

*Fig.9*

| MATERIAL | LATTICE CONSTANT a (nm) |
|---|---|
| Ag | 0.4100 |
| Au | 0.4077 |
| Cu | 0.3615 |
| Cr | 0.2884 |
| Al | 0.40494 |
| Pt | 0.3925 |
| V | 0.303 |
| W | 0.3156 |
| Fe2TiSi | 0.5732 |
| Fe | 0.28665 |
| MgO | 0.4212 |
| TiO2 | 0.4174 |
| HfO2 | 0.5117 |
| MgAl2O4 | 0.8083 |
| ZnAl2O4 | 0.8062 |
| γ-Al2O3 | 0.791 |
| MgGa2O4 | 0.8284 |

Fig.10

| MATERIAL | LATTICE CONSTANT a (nm) |
|---|---|
| Co2MnSi | 0.5606 |
| Co2MnGe | 0.5711 |
| Co2MnGa | 0.5770 |
| Co2FeGa | 0.5677 |
| Co2FeSi | 0.5658 |
| Co2MnSn | 0.5982 |
| Co2MnAl | 0.5664 |
| Co2FeAl | 0.5730 |
| Co2CrAl | 0.5890 |
| Co2VAl | 0.5800 |
| Co2MnGa0.5Sn0.5 | 0.5870 |
| Co2FeGeGa | 0.5740 |
| Fe2TiSi | 0.5732 |

Fig. 11

| | THIRD INSERTION LAYER 40C | | FIRST FERROMAGNETIC LAYER 4 | NONMAGNETIC MATERIAL 5B | SECOND FERROMAGNETIC LAYER 6 | FOURTH INSERTION LAYER 60C | | MR RATIO | LATTICE MISMATCH RATIO (%) |
|---|---|---|---|---|---|---|---|---|---|
| | MATERIAL | THICKNESS (nm) | MATERIAL | MATERIAL | MATERIAL | MATERIAL | THICKNESS (nm) | (%) | R4: FIRST (SECOND) INSERTION LAYER / FIRST (SECOND) FERROMAGNETIC LAYER 4(6) |
| COMPARATIVE EXAMPLE 1 | NONE | – | Fe | Ag | Fe | NONE | – | 1.6 | – |
| EXAMPLE 5 | Fe2TiSi | 0.2 | ″ | ″ | ″ | Fe2TiSi | 0.2 | 1.7 | 0 |
| | ″ | 0.5 | ″ | ″ | ″ | ″ | 0.5 | 2.0 | 0 |
| | ″ | 1 | ″ | ″ | ″ | ″ | 1 | 2.5 | 0 |
| | ″ | 2 | ″ | ″ | ″ | ″ | 2 | 2.6 | 0 |
| | ″ | 3 | ″ | ″ | ″ | ″ | 3 | 2.6 | 0 |
| COMPARATIVE EXAMPLE 2 | NONE | – | Co2MnSi | Ag | Co2MnSi | NONE | – | 8.8 | – |
| EXAMPLE 6 | Fe2TiSi | 2 | ″ | ″ | ″ | Fe2TiSi | 2 | 14.3 | 2.2 |
| | ″ | ″ | ″ | Au | ″ | ″ | ″ | 15.1 | 2.2 |
| | ″ | ″ | ″ | Cu | ″ | ″ | ″ | 9.1 | 2.2 |
| | ″ | ″ | ″ | Cr | ″ | ″ | ″ | 13.3 | 2.2 |
| | ″ | ″ | ″ | Al | ″ | ″ | ″ | 10.5 | 2.2 |
| | ″ | ″ | ″ | Pt | ″ | ″ | ″ | 10.4 | 2.2 |
| | ″ | ″ | ″ | V | ″ | ″ | ″ | 9.0 | 2.2 |
| | ″ | ″ | ″ | W | ″ | ″ | ″ | 9.0 | 2.2 |
| COMPARATIVE EXAMPLE 3 | NONE | – | ″ | MgO | ″ | NONE | – | 36 | – |
| EXAMPLE 7 | Fe2TiSi | 2 | ″ | ″ | ″ | Fe2TiSi | 2 | 52 | 2.2 |
| | ″ | ″ | ″ | TiO2 | ″ | ″ | ″ | 44 | 2.2 |
| | ″ | ″ | ″ | HfO2 | ″ | ″ | ″ | 40 | 2.2 |
| | ″ | ″ | ″ | MgAl2O4 | ″ | ″ | ″ | 74 | 2.2 |
| EXAMPLE 8 | ″ | ″ | ″ | ZnAl2O4 | ″ | ″ | ″ | 72 | 2.2 |
| | ″ | ″ | ″ | γ–Al2O3 | ″ | ″ | ″ | 43 | 2.2 |
| | ″ | ″ | ″ | MgGa2O4 | ″ | ″ | ″ | 47 | 2.2 |

Fig.12

| MATERIAL | LATTICE CONSTANT a | LATTICE MISMATCH RATIO WITH Fe2TiSi R4 (%) |
|---|---|---|
| Co2MnSi | 0.5606 | 2.2 |
| Co2MnGe | 0.5711 | 0.4 |
| Co2MnGa | 0.5770 | -0.7 |
| Co2FeGa | 0.5677 | 1.0 |
| Co2FeSi | 0.5658 | 1.3 |
| Co2MnSn | 0.5982 | -4.2 |
| Co2MnAl | 0.5664 | 1.2 |
| Co2FeAl | 0.5730 | 0.0 |
| Co2CrAl | 0.5890 | -2.7 |
| Co2VAl | 0.5800 | -1.2 |
| Co2MnGa0.5Sn0.5 | 0.5870 | -2.4 |
| Co2FeGeGa | 0.5740 | -0.1 |
| Fe2TiSi | 0.5732 | 0 |

Fig. 13

| | FIRST FERROMAGNETIC LAYER 4 | NONMAGNETIC MATERIAL 5B | SECOND FERROMAGNETIC LAYER 6 | | MR RATIO |
| --- | --- | --- | --- | --- | --- |
| | | | FIRST HEUSLER LAYER 60A | SECOND HEUSLER LAYER 60B | |
| | MATERIAL | MATERIAL | MATERIAL | MATERIAL | (%) |
| COMPARATIVE EXAMPLE 1 | Fe | Ag | | Fe | 1.6 |
| COMPARATIVE EXAMPLE 4 | " | " | | Co2MnSi | 4.0 |
| EXAMPLE 9 | " | " | Co2FeSi | NiMnSb | 4.5 |
| EXAMPLE 10 | " | " | Co2FeSi | " | 5.5 |
| EXAMPLE 11 | " | " | Co2FeSi | Co2MnSi | 9.3 |
| | " | Au | " | " | 9.5 |
| | " | Cu | " | " | 6.2 |
| | " | Cr | " | " | 8.8 |
| | " | Al | " | " | 8.1 |
| | " | Pt | " | " | 8.0 |
| | " | V | " | " | 6.0 |
| | " | W | " | " | 6.3 |
| COMPARATIVE EXAMPLE 5 | " | MgO | | Co2MnSi | 19 |
| EXAMPLE 12 | " | TiO2 | Co2FeSi | Co2MnSi | 35 |
| | " | HfO2 | " | " | 33 |
| | " | MgAl2O4 | " | " | 31 |
| EXAMPLE 13 | " | ZnAl2O4 | " | " | 38 |
| | " | r-Al2O3 | " | " | 36 |
| | " | MgGa2O4 | " | " | 22 |
| | " | | " | " | 25 |

MAGNETORESISTIVE EFFECT ELEMENT, MAGNETIC HEAD, SENSOR, HIGH FREQUENCY FILTER, AND OSCILLATION ELEMENT

CROSS-REFERENCE TO RELATED APPLICATIONS

This application claims the benefit of priority from Japanese Patent Application No. 2017-127266, filed Jun. 29, 2017 and Japanese Patent Application No. 2017-197885, filed Oct. 11, 2017, the entire contents of which are incorporated herein by reference.

TECHNICAL FIELD

The present disclosure relates to a magnetoresistive effect element, and a magnetic head, a sensor, a high frequency filter, and an oscillation element which uses the same.

BACKGROUND

A giant magnetoresistive (GMR) effect element in the related art includes a first ferromagnetic layer as a fixed magnetization layer, a second ferromagnetic layer as a free magnetization layer, and a nonmagnetic spacer layer provided between the first ferromagnetic layer and the second ferromagnetic layer. That is, the GMR effect element has a structure of a ferromagnetic layer/nonmagnetic spacer layer/ferromagnetic layer. In the GMR effect element, spinning electrons are capable of flowing in the upper and lower ferromagnetic layers with passing through the ferromagnetic layers, in a state where directions of magnetization of the ferromagnetic layers are aligned. A current-perpendicular-to-plane GMR (CPP-GMR) effect element has a magnetoresistive effect smaller than that of a tunnel magnetoresistive (TMR) effect element. Thus, in the GMR effect element disclosed in Patent Document 1 an attempt to improve the magnetoresistive effect by using a Heusler alloy ($Co_2(Fe, Mn)Si$) in the ferromagnetic layer and using Ag in the nonmagnetic spacer layer is provided.

Patent Document 1: Japanese Unexamined Patent Publication No. 2012-490914.

SUMMARY

However, according to the knowledges of the inventors of the present application, in the case of a magnetoresistive effect element in which a Heusler alloy and nonmagnetic metal are merely combined, the magnetoresistive effect is not sufficient. In a case of a magnetoresistive effect element using a Heusler alloy, the magnetoresistance ratio at a low temperature is high, but the magnetoresistance ratio is low at room temperature because of high temperature dependence.

Considering such circumstances, an object of the present disclosure is to provide a magnetoresistive effect element having an improved magnetoresistive effect.

To achieve the above object, a first magnetoresistive effect element includes a first ferromagnetic layer as a fixed magnetization layer, a second ferromagnetic layer as a free magnetization layer, and a nonmagnetic spacer layer provided between the first ferromagnetic layer and the second ferromagnetic layer. The nonmagnetic spacer layer includes at least one of a first insertion layer provided under the nonmagnetic spacer layer and a second insertion layer provided over the nonmagnetic spacer layer. The first insertion layer and the second insertion layer are made of $Fe_2TiSi$.

In this case, $Fe_2TiSi$ causes a difference of a lattice constant of the nonmagnetic spacer layer from all the first ferromagnetic layer and the second ferromagnetic layer to be sufficiently small. Thus, distortion at an interface is alleviated. Thus, temperature dependence is improved and the magnetoresistance ratio at room temperature increases.

Preferably, a thickness of each of the first insertion layer and the second insertion layer is equal to or smaller than 3 nm. The insertion layer serves as a resistor. Thus, it is necessary that the insertion layer is a sufficiently thin film, in order to obtain a large magnetoresistance ratio. In addition, it is necessary that the insertion layer is sufficiently thick film, in order to obtain an effect as the insertion layer. In a case where the insertion layer is equal to or smaller than 3 nm, it is possible to obtain a high magnetoresistance ratio by balance between the effect of the insertion layer and an output by magnetoresistance.

A second magnetoresistive effect element includes a first ferromagnetic layer as a fixed magnetization layer, a second ferromagnetic layer as a free magnetization layer, a nonmagnetic spacer layer provided between the first ferromagnetic layer and the second ferromagnetic layer, a third insertion layer provided on a surface of the first ferromagnetic layer, which is opposite to a surface thereof in contact with the nonmagnetic spacer layer, and a fourth insertion layer provided on a surface of the second ferromagnetic layer, which is opposite to a surface thereof in contact with the nonmagnetic spacer layer. The third insertion layer and the fourth insertion layer are made of $Fe_2TiSi$.

In this case, $Fe_2TiSi$ causes a difference of a lattice constant from all the first ferromagnetic layer and the second ferromagnetic layer to be sufficiently small. Thus, distortion at an interface is alleviated. In addition, since $Fe_2TiSi$ has a structure similar to that of any of the first and second ferromagnetic layers, an electronic band of the ferromagnetic layer is stabilized. Accordingly, temperature dependence is improved and the magnetoresistance ratio at room temperature increases.

The thickness of each of the third insertion layer and the fourth insertion layer is equal to or greater than 1 nm.

Preferably, at least one of the first ferromagnetic layer and the second ferromagnetic layer is made of a ferromagnetic material including a Heusler alloy. In this case, it is possible to obtain a magnetoresistance ratio larger than that in a case where the ferromagnetic layer is made of a ferromagnetic material other than the Heusler alloy.

A third magnetoresistive effect element includes a first ferromagnetic layer as a fixed magnetization layer, a second ferromagnetic layer as a free magnetization layer, and a nonmagnetic spacer layer provided between the first ferromagnetic layer and the second ferromagnetic layer. At least one of the first ferromagnetic layer and the second ferromagnetic layer includes a first Heusler layer in contact with the nonmagnetic spacer layer and a second Heusler layer which is in contact with the first Heusler layer and has a composition different from that of the first Heusler layer.

In this case, since the first Heusler layer has a structure similar to that of the second Heusler layer, an electronic band of the ferromagnetic layer is stabilized. Accordingly, temperature dependence is improved and the magnetoresistance ratio at room temperature increases.

Preferably, the first Heusler layer is made of $Co_2FeSi$. In this case, even though annealing at 400° C. is performed, it is possible to suppress the decrease of the magnetoresistance ratio and to obtain the high magnetoresistance ratio.

Preferably, the second Heusler layer is made of $Co_2MnSi$. In this case, even though annealing at 400° C. is performed, it is possible to suppress the decrease of the magnetoresistance ratio and to obtain the high magnetoresistance ratio.

The nonmagnetic spacer layer may include at least one metal element of Ag, Au, Cu, Cr, V, Al, W, and Pt. In this case, it is possible to obtain a high magnetoresistance ratio.

The nonmagnetic spacer layer may be made of MgO, $Al_2O_3$, $TiO_2$, or $HfO_2$, or may be a tunnel barrier having a spinel structure. In this case, it is possible to obtain a high magnetoresistance ratio.

The tunnel barrier having the spinel structure may be made of any one of $MgAl_2O_4$, $ZnAl_2O_4$, $\gamma$-$Al_2O_3$, and $MgGa_2O_4$, or may have a mixed crystal structure in which one of $MgAl_2O_4$, $ZnAl_2O_4$, $\gamma$-$Al_2O_3$, or $MgGa_2O_4$ is provided as the main component. In this case, even in a case using MgO, $Al_2O_3$, $TiO_2$, or $HfO_2$, it is possible to obtain a larger magnetoresistance ratio.

A magnetic head, a sensor, a high frequency filter, or an oscillation element using any of the above-described magnetoresistive effect elements has a large magnetoresistance effect, and thus can exhibit excellent characteristics.

According to the magnetoresistive effect element of the present disclosure, it is possible to improve the magnetoresistance effect.

BRIEF DESCRIPTION OF THE DRAWINGS

FIG. 8 is a table illustrating a relationship between a material of the magnetoresistive effect element and an MR ratio.

FIG. 9 is a table illustrating lattice constants of various materials.

FIG. 10 is another table illustrating lattice constants of various materials.

FIG. 11 is a table illustrating the relationship between the material of the magnetoresistive effect element and the MR ratio.

FIG. 12 is a table illustrating lattice constants and lattice mismatch ratios of the various materials.

FIG. 13 is a table illustrating the relationship between the material of the magnetoresistive effect element and the MR ratio.

DETAILED DESCRIPTION

Hereinafter, magnetoresistive effect elements according to embodiments will be described. The same components are denoted by the same reference signs and descriptions thereof will not be repeated. In a case using a three-dimensional orthogonal coordinate system, a thickness direction of each layer is set as a Z-axis direction, and two orthogonal axes which are vertical to a Z axis are set to be an X axis and a Y axis, respectively.

Figure 1:
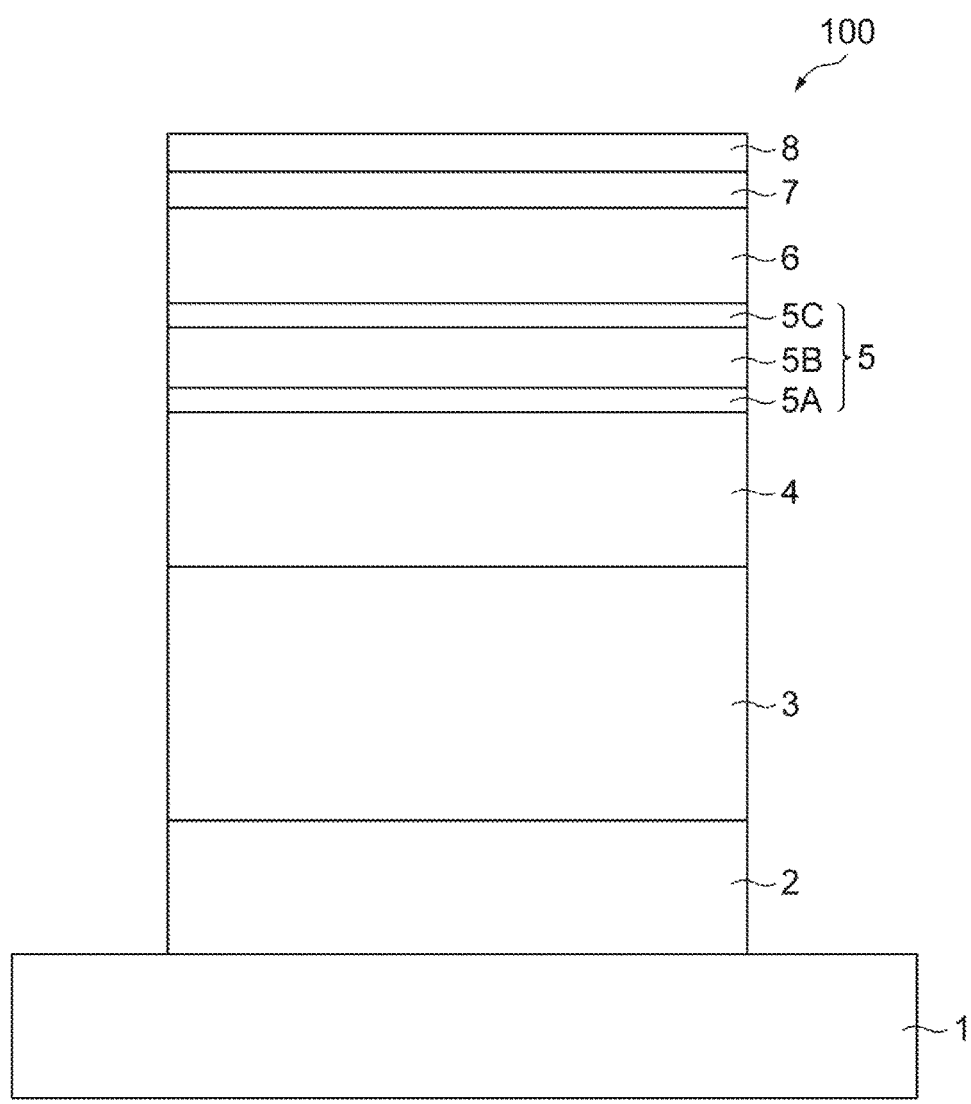
FIG. 1 is a sectional view illustrating a magnetoresistive effect element 100 according to a first embodiment.

FIG. 1 is a sectional view illustrating a magnetoresistive effect element 100 according to a first embodiment.

In the magnetoresistive effect element 100, a first nonmagnetic metal layer 2 and a second nonmagnetic metal layer 3 are sequentially provided on a substrate 1. In the magnetoresistive effect element, a first ferromagnetic layer 4 as a fixed magnetization layer, a nonmagnetic spacer layer 5, and a second ferromagnetic layer 6 as a free magnetization layer are sequentially stacked. A cap nonmagnetic metal layer 7 and a contact metal layer 8 are sequentially foiled on the second ferromagnetic layer 6. The nonmagnetic spacer layer 5 is interposed between the first ferromagnetic layer 4 and the second ferromagnetic layer 6 which are made of a ferromagnetic material. If a bias is applied between the first nonmagnetic metal layer 2 or the second nonmagnetic metal layer 3 positioned below and the contact metal layer 8 positioned at the top, electrons having a spin of a specific direction can flow in a direction vertical to the surface of the film.

The direction of magnetization of the first ferromagnetic layer (fixed magnetization layer) 4 is fixed. The direction of magnetization of the second ferromagnetic layer (free magnetization layer) 6 can change in accordance with an external magnetic field. Thus, the quantity of passing electrons changes in accordance with the intensity of the external magnetic field. If the quantity of passing electrons is large, resistance is low. If the quantity of passing electrons is small, resistance is high. The first ferromagnetic layer 4 as the fixed magnetization layer is thicker than the second ferromagnetic layer 6 and has more difficulty in changing the direction of magnetization in accordance with the external magnetic field than the second ferromagnetic layer 6 because of a distance and the like of shape magnetic anisotropy between the layers after microfabrication. Thus, the first ferromagnetic layer functions as the fixed magnetization layer in which the direction of magnetization is substantially fixed.

Preferably, MgO can be used for the substrate 1. The material of the substrate is not particularly limited so long as the material has adequate mechanical strength and is suitable for heating treatment or microfabrication. For example, a metal oxide single crystal substrate, a silicon single crystal substrate, a silicon single crystal substrate with a thermal oxide film, a sapphire single crystal substrate, a ceramic substrate, a quartz substrate, and a glass substrate can be used. If a substrate includes MgO single crystal, an epitaxial growth film is easily formed. The epitaxial growth film can exhibit large magnetoresistance characteristics.

Preferably, Cr can be used for the first nonmagnetic metal layer 2. In addition, the first nonmagnetic metal layer may include a stacked structure of a material which includes, for example, at least one metal element of Ag, Au, Cu, Cr, V, Al, W, and Pt and is made of alloys of the above metal elements or two kinds or more of the above metal elements, in order to control crystal alignment of the upper layer. The alloys of the metal elements include, for example, cubic AgZn alloys, AgMg alloys, and NiAl alloys.

Preferably, Ag can be used for the second nonmagnetic metal layer 3. In addition, the second nonmagnetic metal layer may include a stacked structure of a material which includes, for example, at least one metal element of Ag, Au, Cu, Cr, V, Al, W, and Pt and is made of alloys of the above metal elements or two kinds or more of the above metal elements. The alloys of the metal elements include, for example, cubic AgZn alloys, AgMg alloys, and NiAl alloys.

Preferably, $Co_2MnSi$ which is a Heusler alloy can be used for the first ferromagnetic layer 4 and the second ferromagnetic layer 6. In addition, the first ferromagnetic layer and the second ferromagnetic layer can include Heusler alloys such as $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGaSn$, $Co_2FeGeGa$, $Co_2MnGeGa$, $Co_2FeGaSi$, $Co_2FeGeSi$, $Co_2CrIn$, and $Co_2CrSn$ or include ferromagnetic materials such as $Fe_3O_4$, $CrO_2$, and CoFeB. Alternatively, the first ferromagnetic layer and the second ferromagnetic layer can be made of substantially the ferromagnetic material.

The Heusler alloys having half-metal characteristics are promising among the ferromagnetic materials. A Co-based Heusler alloy among the Heusler alloys can exhibit half-metal characteristics even at room temperature because a Curie temperature thereof is very high.

The nonmagnetic spacer layer 5 is provided between the first ferromagnetic layer 4 and the second ferromagnetic layer 6. The nonmagnetic spacer layer 5 includes a nonmagnetic material 5B and at least one of a first insertion layer 5A provided under the nonmagnetic material 5B and a second insertion layer 5C provided over the nonmagnetic material 5B. That is, a structure in which one of the first insertion layer 5A and the second insertion layer 5C is omitted and the nonmagnetic material 5B at the center is in contact with any of the upper and lower ferromagnetic layers can also be made.

The first insertion layer 5A and the second insertion layer 5C are made of $Fe_2TiSi$.

Preferably, $MgAl_2O_4$ can be used as the nonmagnetic material 5B. In addition, the nonmagnetic material 5B can include any one of MgO, $Al_2O_3$, $TiO_2$, $HfO_2$, $ZnAl_2O_4$, $\gamma$-$Al_2O_3$, and $MgGa_2O_4$ or can include a mixed crystal structure in which one of the above substances is provided as the main component. Further, the nonmagnetic material 5B can also be made of alloys or the like including at least one metal element of Ag, Au, Cu, Cr, V, Al, W, and Pt as the nonmagnetic metal material.

In this case, a lattice matching property between any insertion layer (first insertion layer 5A or second insertion layer 5C) including $Fe_2TiSi$ and the nonmagnetic material 5B is high. A difference of the lattice constant between the insertion layer (first insertion layer 5A or second insertion layer 5C) and the ferromagnetic layer (first ferromagnetic layer 4 or second ferromagnetic layer 6) positioned on the outside of the insertion layer is sufficiently small, and thus distortion at an interface is alleviated. Thus, temperature dependence is improved and the magnetoresistance ratio at room temperature increases.

Preferably, Ag can be used for the cap nonmagnetic metal layer 7. In addition, for example, the cap nonmagnetic metal layer may include a stacked structure of a material made of one or more metal elements of Ru, Ag, Al, Cu, Au, Cr, Mo, Pt, W, Ta, Pd, and Ir, alloys of the above metal elements, or two kinds or more of the above metal elements.

Preferably, Ru can be used for the contact metal layer 8. In addition, for example, the contact metal layer may include a stacked structure of a material made of one or more metal elements of Ru, Ag, Al, Cu, Au, Cr, Mo, Pt, W, Ta, Pd, and Ir, alloys of the above metal elements, or two kinds or more of the above metal elements.

The material and the thickness (desirable range) of each layer are as follows.

Contact metal layer 8: Ru, 5 nm, (3 nm to 8 nm)
Cap nonmagnetic metal layer 7: Ag, 5 nm, (3 nm to 8 nm)
Second ferromagnetic layer 6: $Co_2MnSi$ (cobalt manganese silicon alloy), 6 nm, (3 nm to 20 nm)
Second insertion layer 5C: $Fe_2TiSi$, 1 nm, (0.2 nm to 3 nm)
Nonmagnetic material 5B: $MgAl_2O_4$, 2 nm, (1 nm to 10 nm)
First insertion layer 5A: $Fe_2TiSi$, 1 nm, (0.2 nm to 3 nm)
First ferromagnetic layer 4: $Co_2MnSi$ (cobalt manganese silicon alloy), 10 nm, (3 nm to 20 nm)
Second nonmagnetic metal layer 3: Ag, 50 nm, (20 nm to 100 nm)
First nonmagnetic metal layer 2: Cr, 20 nm, (10 nm to 30 nm)
First base layer 1: MgO, 0.5 mm, (0.1 mm to 2 mm)

Next, superiority of the first embodiment will be described.

An MR ratio is provided as an index for evaluating the performance of a magnetoresistive effect element. The MR ratio is given by [((resistance value of an element in a case where the direction of magnetization is antiparallel)−(resistance value of an element in a case where the direction of magnetization is parallel))/(resistance value of an element in a case where the direction of magnetization is parallel)].

Regarding the MR ratio, in a magnetoresistive effect element having large lattice mismatch between the ferromagnetic layer (first ferromagnetic layer 4 or second ferromagnetic layer 6) and the nonmagnetic spacer layer 5, it is difficult to improve crystallinity of the layers, and the Curie temperature at a stacking interface decreases. As a result, it is difficult to sufficiently improve the MR ratio at room temperature.

In the first magnetoresistive effect element 100 in the first embodiment, the nonmagnetic spacer layer 5 includes at least one of the first insertion layer 5A and the second insertion layer 5C made of $Fe_2TiSi$ such that lattice mismatch between the nonmagnetic spacer layer 5 and the ferromagnetic layer (first ferromagnetic layer 4 or second ferromagnetic layer 6) is smaller than that when the entirety of the nonmagnetic spacer layer is made of only the nonmagnetic material 5B. Therefore, according to the magnetoresistive effect element, crystallinity of the ferromagnetic layer (first ferromagnetic layer 4 or second ferromagnetic layer 6) and the nonmagnetic spacer layer 5 is improved. Thus, temperature characteristics are improved, and it is possible to sufficiently improve the MR ratio even at room temperature.

The thickness of each of the first insertion layer 5A and the second insertion layer 5C is preferably equal to or smaller than 3 nm. The insertion layer serves as a resistor. Thus, it is necessary that the insertion layer is a sufficiently thin film, in order to obtain a large magnetoresistance ratio. In addition, it is necessary that the insertion layer is sufficiently thick film, in order to obtain an effect as the insertion layer. In a case where the insertion layer is equal to or smaller than 3 nm, it is possible to obtain a high magnetoresistance ratio by balance between the effect of the insertion layer and an output by magnetoresistance.

The Heusler alloys having half-metal characteristics are promising among the ferromagnetic materials, for the ferromagnetic layer (first ferromagnetic layer 4 or second ferromagnetic layer 6). A Co-based Heusler alloy among the Hensler alloys can exhibit half-metal characteristics even at room temperature because a Curie temperature thereof is very high.

Further, the ferromagnetic layer can be made of Heusler alloys such as $Co_2MnSi$, $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGaSn$, $Co_2FeGeGa$, $Co_2MnGeGa$, $Co_2FeGaSi$, $Co_2FeGeSi$, $Co_2CrIn$, and $Co_2CrSn$ as the Co-based Heusler alloys. That is, since the ferromagnetic layer includes $Fe_2TiSi$ and has a favorable lattice matching property, it is possible to exhibit half-metal characteristics even at room temperature and to obtain a high MR ratio.

The following is considered. That is, if $Fe_2TiSi$ is bonded to the Heusler alloy, a Fermi level of half-metal in the Heusler alloy moves to the center of the electronic band thereof. Thus, it is possible to exhibit half-metal characteristics or to reduce temperature dependence of an output.

As the nonmagnetic material 5B, MgO, $TiO_2$, $HfO_2$, and the like are preferable. That is, since the ferromagnetic layer includes $Fe_2TiSi$ and has a favorable lattice matching property, it is possible to exhibit half-metal characteristics even at room temperature and to obtain a high MR ratio.

In addition, as the nonmagnetic material 5B, $MgAl_2O_4$, $ZnAl_2O_4$, $\gamma\text{-}Al_2O_3$, $MgGa_2O_4$, and the like are preferable. That is, since the ferromagnetic layer includes $Fe_2TiSi$ and has a favorable lattice matching property, it is possible to exhibit half-metal characteristics even at room temperature and to obtain a high MR ratio.

In addition, it is preferable that the nonmagnetic material 5B includes at least one metal element of Ag, Au, Cu, Cr, V, Al, W, and Pt. Since the above substance has a favorable lattice matching property with $Fe_2TiSi$, it is possible to expect the similar effect in a GMR effect element in which the nonmagnetic material 5B is used as a nonmagnetic metal material, to exhibit half-metal characteristics even at room temperature, and to obtain a high MR ratio.

As described above, in the magnetoresistive effect element 100 in the first embodiment, it is possible to obtain a high MR ratio even at room temperature.

Figure 2:
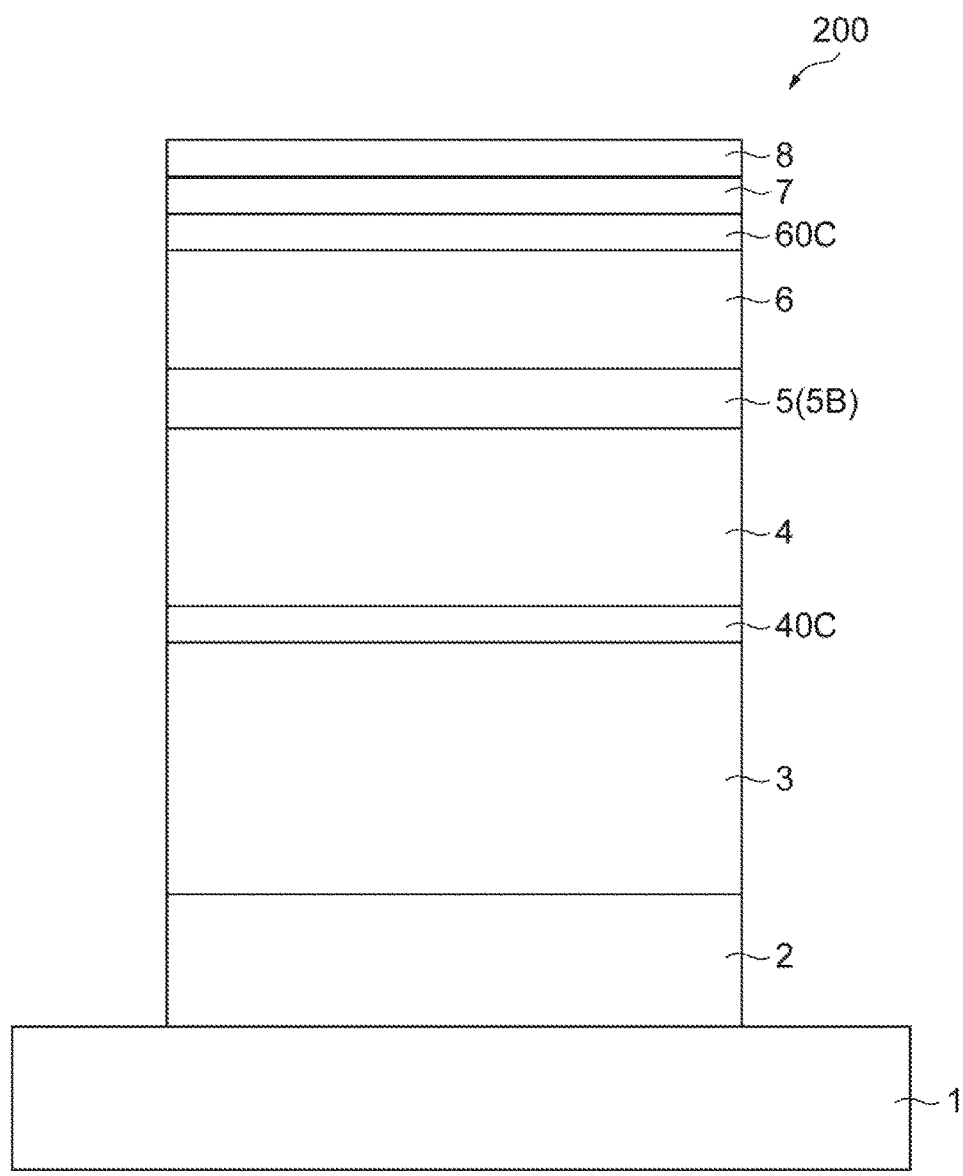
FIG. 2 is a sectional view illustrating a magnetoresistive effect element 200 according to a second embodiment.

Next, a second embodiment will be described. FIG. 2 is a sectional view illustrating a magnetoresistive effect element 200 according to the second embodiment. In the second embodiment, the magnetoresistive effect element includes a third insertion layer and a fourth insertion layer instead of the first insertion layer and the second insertion layer in the structure in FIG. 1. The third insertion layer is provided on a surface of the first ferromagnetic layer, which is opposite to a surface thereof in contact with the nonmagnetic spacer layer. The fourth insertion layer is provided on a surface of the second ferromagnetic layer, which is opposite to a surface thereof in contact with the nonmagnetic spacer layer. The third insertion layer and the fourth insertion layer are made of $Fe_2TiSi$. Other materials and structures are the same as those described in the first embodiment.

The superiority of the second embodiment will be described.

A second magnetoresistive effect element 200 in the second embodiment includes the first ferromagnetic layer 4 as the fixed magnetization layer, the second ferromagnetic layer 6 as the free magnetization layer, the nonmagnetic spacer layer 5 provided between the first ferromagnetic layer 4 and the second ferromagnetic layer 6, a third insertion layer 40C, and a fourth insertion layer 60C. The third insertion layer 40C is provided on a surface of the first ferromagnetic layer 4, which is opposite to a surface thereof in contact with the nonmagnetic spacer layer 5. The fourth insertion layer 60C is provided on a surface of the second ferromagnetic layer 6, which is opposite to a surface thereof in contact with the nonmagnetic spacer layer 5. The third insertion layer 40C and the fourth insertion layer 60C are made of $Fe_2TiSi$.

In the Heusler alloy having half-metal characteristics, the Curie temperature is low, and the electronic band easily becomes unstable, because lattice distortion or disorder of atom arrangement such as diffusion of atoms occurs by lattice mismatch in the vicinity of a stacking interface. As a result, the half-metal characteristics are impaired, and it is difficult to increase the magnetoresistance ratio at room temperature.

The magnetoresistive effect element 200 in the second embodiment has a stacked structure in which the first ferromagnetic layer 4 is in contact with the third insertion layer 40C and the second ferromagnetic layer 6 is in contact with the fourth insertion layer 60C. Thus, since the one surface of first ferromagnetic layer 4 is in contact with the third insertion layer 40C having a favorable lattice matching property and one surface of the second ferromagnetic layer 6 is in contact with the fourth insertion layer 60C having a favorable lattice matching property, the electronic band becomes stable easier than that when a Heusler alloy which has a single layer and does not have the insertion layer is used. Accordingly, temperature dependence is improved and the magnetoresistance ratio at room temperature increases.

$Fe_2TiSi$ for the third insertion layer and the fourth insertion layer has a crystal structure similar to that of the Co-based Hensler alloy described in the first embodiment. Thus, the electronic band of the ferromagnetic layer becomes stable, and thus temperature dependence is improved and the magnetoresistance ratio at room temperature increases.

The following is considered. That is, if $Fe_2TiSi$ is bonded to the Heusler alloy, a Fermi level of half-metal in the Heusler alloy moves to the center of the electronic band thereof. Thus, it is possible to exhibit half-metal characteristics or to reduce temperature dependence of an output.

The thickness of each of the third insertion layer and the fourth insertion layer is preferably equal to or greater than 1 nm. Since the third insertion layer and the fourth insertion layer have a thickness of 1 nm or greater, it is possible to effectively realize a favorable lattice matching property with the ferromagnetic layer (first ferromagnetic layer 4 or second ferromagnetic layer 6). As a result, the electronic band becomes stable easier than that when the Heusler alloy which has a single layer and does not have the insertion layer is used. Accordingly, temperature dependence is improved and the magnetoresistance ratio at room temperature increases.

Figure 3:
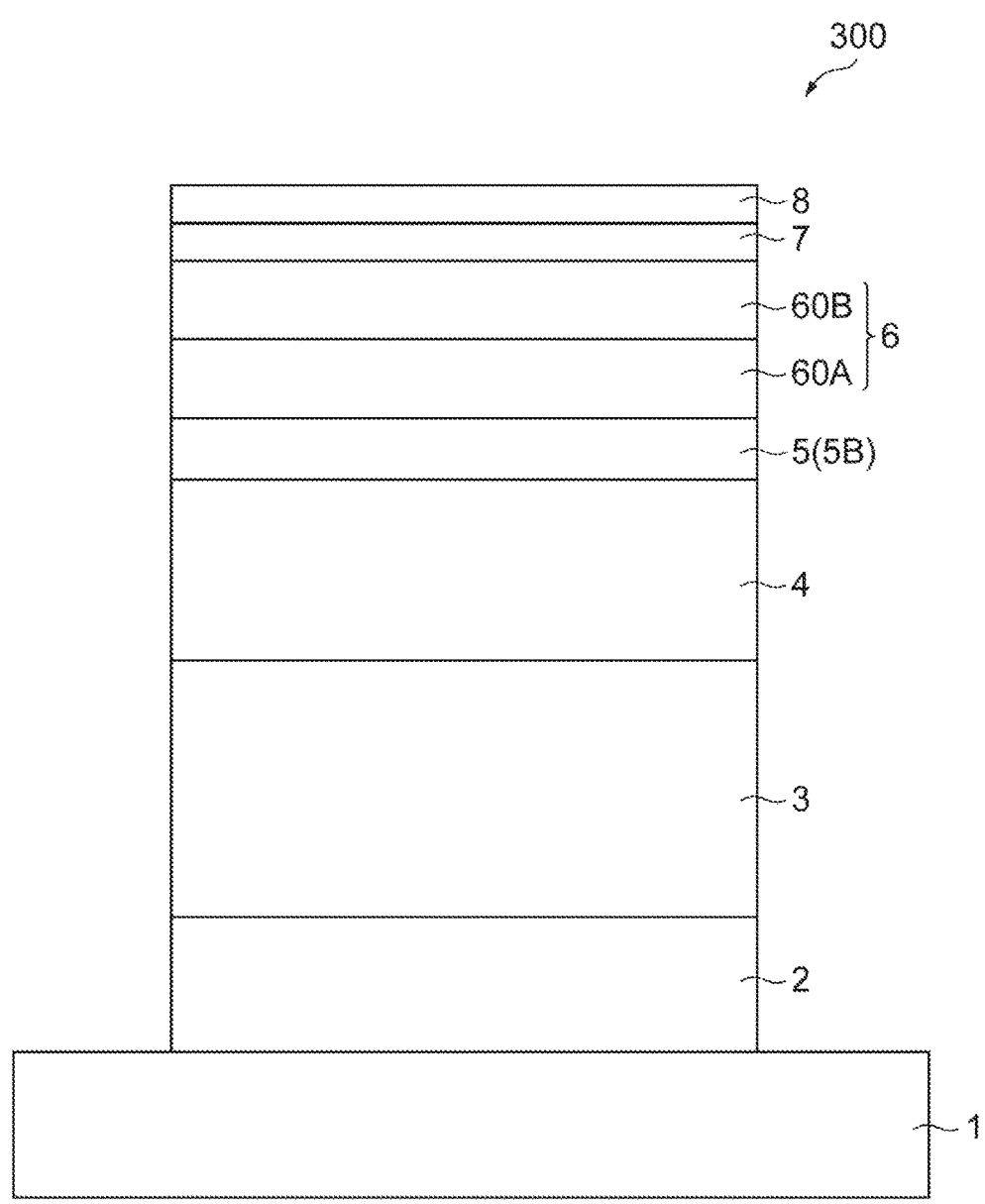
FIG. 3 is a sectional view illustrating a magnetoresistive effect element 300 according to a third embodiment.

Next, a third embodiment will be described. FIG. 3 is a sectional view illustrating a magnetoresistive effect element 300 according to the third embodiment. In the third embodiment, a magnetoresistive effect element does not include the first insertion layer 5A and the second insertion layer 5C in the structure in FIG. 1 and includes a first Heusler layer 60A and a second Heusler layer 60B as the second ferromagnetic layer 6. The first Heusler layer 60A is in contact with the nonmagnetic spacer layer 5(5B). The second Heusler layer 60B is in contact with the first Heusler layer 60A and has a composition different from that of the first Heusler layer 60A. Other materials and structures are the same as those described in the first embodiment.

The superiority of the third embodiment will be described.

The third magnetoresistive effect element 300 in the third embodiment includes the first ferromagnetic layer as the fixed magnetization layer, the second ferromagnetic layer as the free magnetization layer, and the nonmagnetic spacer layer provided between the first ferromagnetic layer and the second ferromagnetic layer. At least one of the first ferromagnetic layer and the second ferromagnetic layer includes the first Heusler layer in contact with the nonmagnetic spacer layer and the second Heusler layer which is in contact with the first Heusler layer and has a composition different from that of the first Heusler layer.

Here, in the Heusler alloy having half-metal characteristics, the Curie temperature is low, and the electronic band easily becomes unstable, because lattice distortion or disorder of atom arrangement such as diffusion of atoms occurs by lattice mismatch in the vicinity of a stacking interface. As a result, the half-metal characteristics are impaired, and it is difficult to increase the magnetoresistance ratio at room temperature.

In the magnetoresistive effect element 300 in the third embodiment, the second ferromagnetic layer 6 has a stacked structure in which the first Heusler layer 60A and the second Heusler layer 60B are stacked. Thus, regarding the first Heusler layer 60A and the second Heusler layer 60B, the first Heusler layer 60A and the second Heusler layer 60B in which one surface has a similar crystal structure are in contact with each other. Thus, the electronic band of the ferromagnetic layer becomes stable easier than that when the ferromagnetic layer is made of a single-layer Heusler alloy. Accordingly, temperature dependence is improved and the magnetoresistance ratio at room temperature increases.

The first Heusler layer 60A is preferably made of $Co_2FeSi$. $Co_2FeSi$ has a high Curie temperature among Co-based Heusler substances and also withstands high-temperature annealing in the process of manufacturing a magnetoresistive effect element. In this case, even though annealing process at 400° C. is performed, it is possible to suppress the decrease of the magnetoresistance ratio and to obtain a high magnetoresistance ratio.

The second Heusler layer 60B is preferably made of $Co_2MnSi$. $Co_2MnSi$ is the same as $Co_2FeSi$ similar to the first Heusler layer 60A. Thus, $Co_2MnSi$ has a high Curie temperature among Co-based Heusler substances and also withstands high-temperature annealing in the process of manufacturing a magnetoresistive effect element. In this case, even though annealing process at 400° C. is performed, it is possible to suppress the decrease of the magnetoresistance ratio and to obtain a high magnetoresistance ratio.

$Co_2MnSi$ and $Co_2FeSi$ withstand high-temperature annealing at 400° C. However, in a case where performing annealing at a higher temperature is needed, it is considered that Mn of $Co_2MnSi$ may firstly diffused when both $Co_2MnSi$ and $Co_2FeSi$ are compared to each other. In this case, in a case where $Co_2MnSi$ is in contact with the nonmagnetic spacer layer 5, Mn is diffused into the nonmagnetic spacer layer. As a result, deterioration of the magnetoresistive effect is expected. Therefore, if the first Heusler layer 60A is made of $Co_2FeSi$ and the second Heusler layer 60B is made of $Co_2MnSi$, it is possible to prevent an occurrence of a situation in which Mn of the second Heusler layer 60B is diffused into the nonmagnetic spacer layer 5. That is, $Co_2FeSi$ of the first Heusler layer 60A functions as a Mn diffusion prevention layer.

Thus, since the first Heusler layer 60A is made of $Co_2FeSi$ and the second Heusler layer 60B is made of $Co_2MnSi$, even though annealing process at a high temperature is performed in the process of manufacturing a magnetoresistive effect element, it is possible to suppress the decrease of the magnetoresistance ratio and to obtain a high magnetoresistance ratio even at room temperature.

The following is considered. That is, even in a case where $Co_2MnSi$ and $Co_2FeSi$ are bonded to each other, electron states thereof influence each other, and a Fermi level of half-metal in the Heusler alloy moves to the center of the electronic band thereof. Thus, it is possible to exhibit half-metal characteristics or to reduce temperature dependence of an output.

As described above, in the magnetoresistive effect element 300 in the third embodiment, it is possible to obtain a high MR ratio even at room temperature.

Although not illustrated, in the third embodiment, the magnetoresistive effect element in which the first Heusler layer 60A in contact with the nonmagnetic spacer layer 5(5B) and the second Heusler layer 60B which is in contact with the first Heusler layer 60A and has a composition different from the first Heusler layer 60A are provided as the second ferromagnetic layer 6 is disclosed. However, even though a first Heusler layer 40A in contact with the nonmagnetic spacer layer 5(5B) and a second Heusler layer 40B which is in contact with the first Heusler layer 40A and has a composition different from the first Heusler layer 40A are provided in the first ferromagnetic layer 4, it is possible to expect effects similar to those in the third embodiment. Further, even though the first Heusler layers 40A and 60A are provided in the first ferromagnetic layer 4 and the second Heusler layers 40B and 60B are provided in the second ferromagnetic layer 6, it is possible to expect the above effects because of the above-described reasons.

Figure 4:
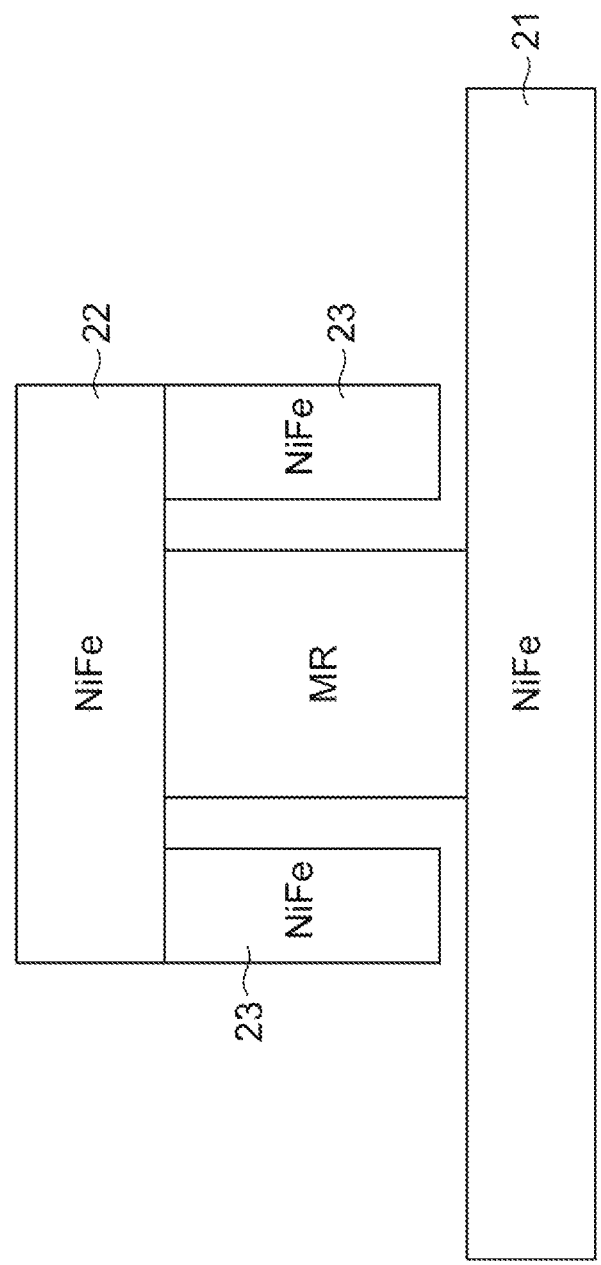
FIG. 4 is a diagram illustrating a sectional configuration of a reproduction unit of a magnetic head including the magnetoresistive effect element.

FIG. 4 is a diagram illustrating a sectional configuration of a reproduction unit of a magnetic head including the magnetoresistive effect element.

The magnetic head includes the magnetoresistive effect element MR illustrated in FIG. 1. Specifically, the magnetic head includes a lower magnetic shield 21, the magnetoresistive effect element MR fixed on the magnetic shield, an upper magnetic shield 22 fixed to the upper portion of the magnetoresistive effect element MR, and a side magnetic shield 23 fixed to the surrounding of the upper magnetic shield 22. The magnetic shield is made of NiFe and the like. The magnetic head having such a structure is known well. The magnetic head disclosed in U.S. Pat. No. 5,695,697 can be used as a reference.

Figure 5:
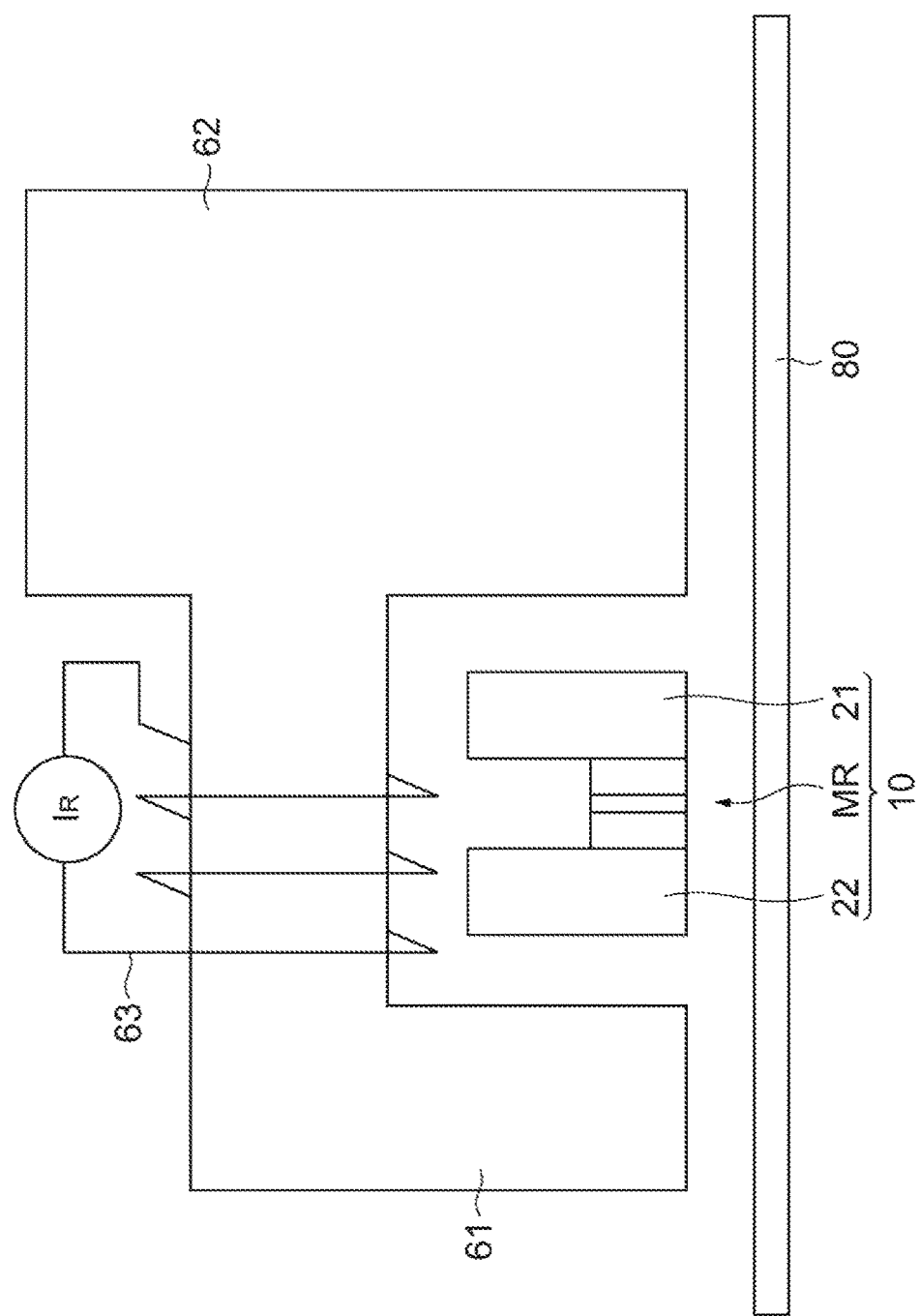
FIG. 5 is a diagram illustrating a sectional configuration of the magnetic head including the magnetoresistive effect element.

FIG. 5 is a diagram illustrating a sectional configuration of the magnetic head including the magnetoresistive effect element MR.

The magnetic head includes a main magnetic pole 61, a circulating magnetic pole 62, and a spin torque oscillator (oscillation element) 10 disposed to be parallel to the main magnetic pole 61. The spin torque oscillator 10 has a structure similar to that of the above-described magnetic head. The spin torque oscillator has a structure in which the lower magnetic shield 21 and the upper magnetic shield 22 as electrodes are disposed over and under the magnetoresistive effect element MR.

A coil 63 is wound around the base end portion of the main magnetic pole 61. Thus, if a drive current is supplied to a current source IR, a write magnetic field is generated around the main magnetic pole 61. The generated magnetic field font's a closed magnetic path through the magnetic pole.

If a DC current flows between the upper and lower electrodes of the spin torque oscillator 10 including the magnetoresistive effect element MR, ferromagnetic resonance occurs by spin torque which is generated by a spin injection layer, and thus a high-frequency magnetic field is generated from the spin torque oscillator 10. High-density magnetic recording is performed on a magnetic recording medium 80 facing a recording magnetic field generated by the main magnetic pole 61 and a high-frequency magnetic field generated by the spin torque oscillator 10, only at a portion at which the recording magnetic field is superimposed on the high-frequency magnetic field. The magnetic head having such a structure is known well. The magnetic head disclosed in U.S. Pat. No. 5,173,750 can be used as a reference.

Figure 6:
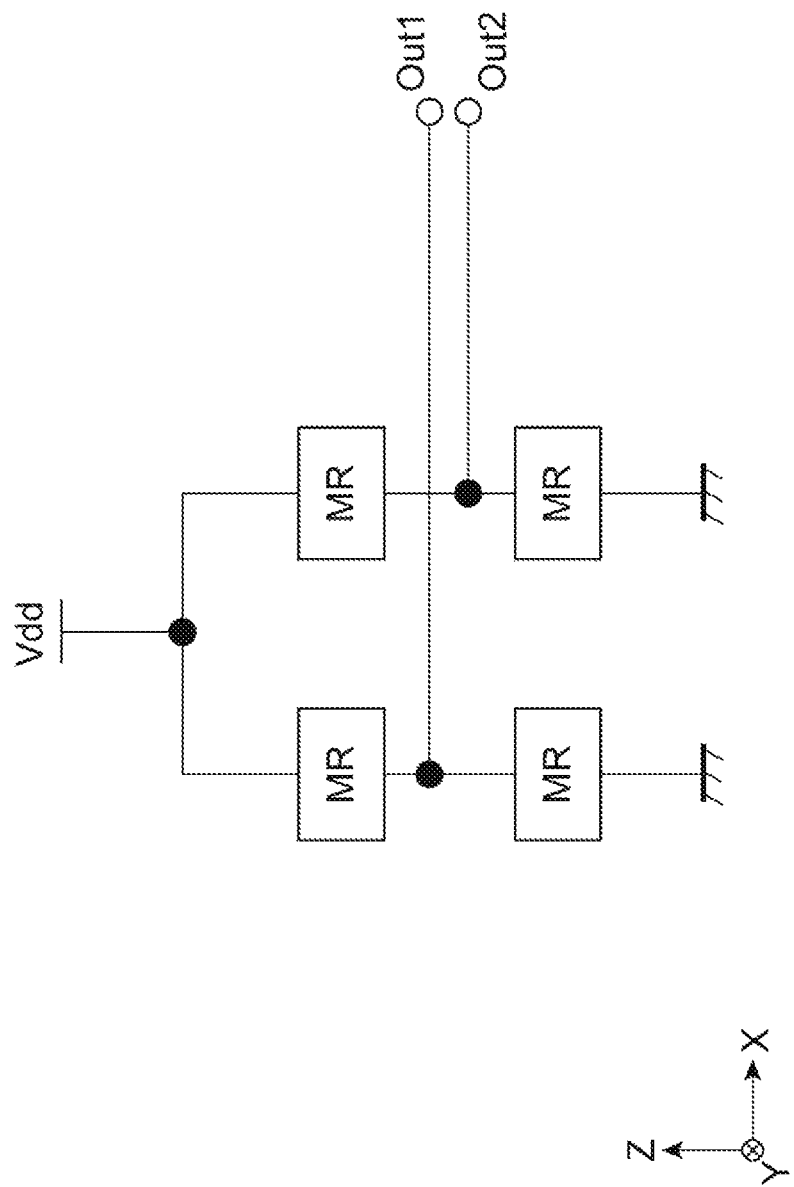
FIG. 6 is a diagram illustrating a structure of a current sensor including a plurality of magnetoresistive effect elements.

FIG. 6 is a diagram illustrating a structure of a current sensor including a plurality of magnetoresistive effect elements.

The current sensor is configured with a bridge circuit obtained by electrically connecting a plurality of magnetoresistive effect elements MR. In FIG. 6, a bridge circuit is configured with four magnetoresistive effect elements MR. Two circuit rows in which the two magnetoresistive effect elements MR are connected to each other in series are connected in parallel between the ground potential and the power supply potential Vdd. Connection points between the two magnetoresistive effect elements MR serve as a first output terminal Out1 and a second output terminal Out2. A voltage between the first output terminal and the second output terminal is an output signal.

If an electric wire as a measurement target extends along the Z-axis direction, a magnetic field is generated around the electric wire, and the resistance value of the magnetoresistive effect element MR changes in accordance with the intensity of the magnetic field. The magnitude of the output signal depends on the intensity of the magnetic field, that is, an amount of a current flowing in the electric wire. Thus, such a device can function as a current sensor. The device also directly functions as a magnetic sensor that detects the intensity of a magnetic field.

Figure 7:
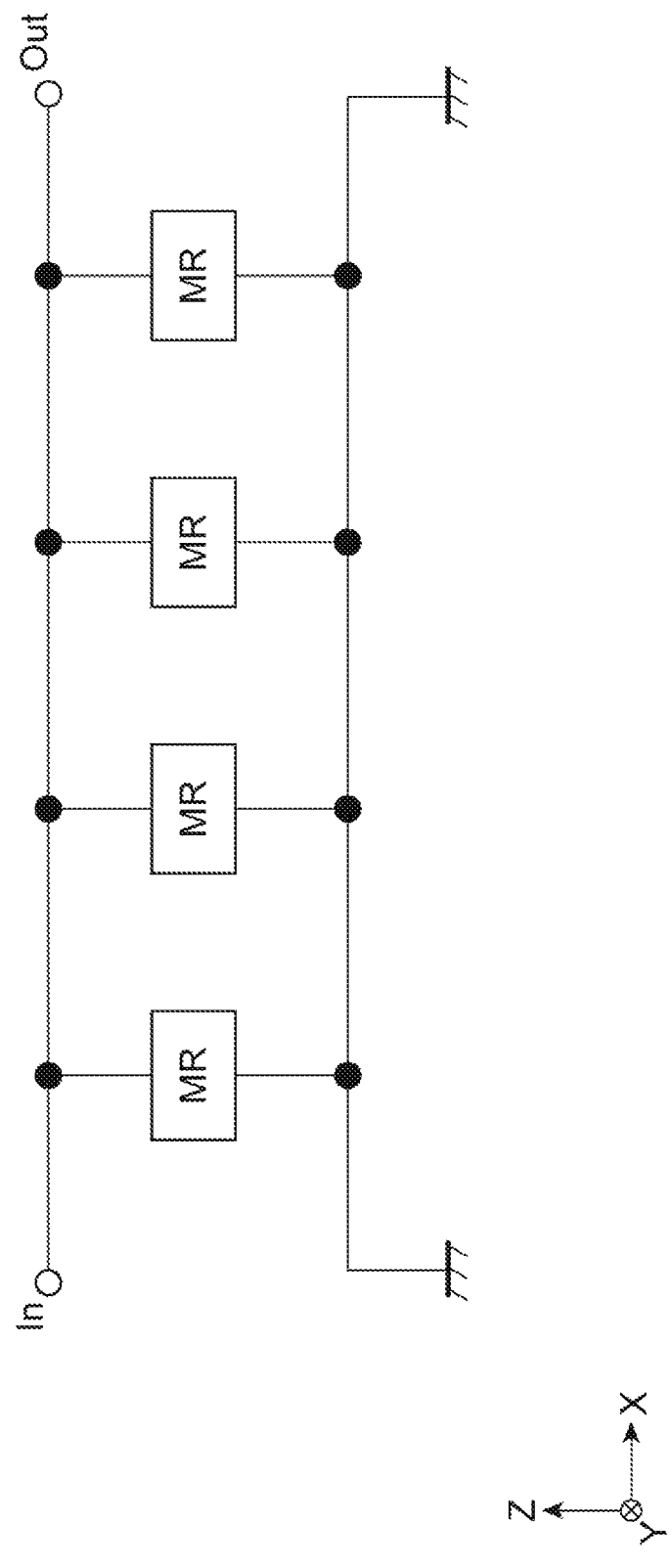
FIG. 7 is a diagram illustrating a structure of a high frequency filter including a plurality of magnetoresistive effect elements.

FIG. 7 is a diagram illustrating a structure of a high frequency filter including a plurality of magnetoresistive effect elements.

The high frequency filter is obtained by electrically connecting a plurality of magnetoresistive effect elements MR in parallel. That is, upper electrodes (shield electrodes or contact electrodes) of the magnetoresistive effect elements MR are connected to each other or are commonly used. In addition, lower electrodes (shield electrodes or first nonmagnetic metal layers) of the magnetoresistive effect elements MR are connected to each other or are commonly used.

The plurality of magnetoresistive effect elements MR has horizontal sectional areas (sectional areas in an XY plane) different from each other, and thus resonance frequencies are different from each other. If a high-frequency signal is input from an input terminal In, the magnetoresistive effect elements MR respectively absorb signal components having frequencies which are equal to resonance frequencies of the magnetoresistive effect elements MR, in the input high-frequency signal. Then, the remaining component of the high-frequency signal is output from the output terminal Out. Thus, the device functions as the high frequency filter. The device having such a structure is known well. For example, the device disclosed in International Publication WO2011/033664 can be used as a reference.

The magnetoresistive effect element in FIG. 1 can be manufactured in a method as follows.

Firstly, the first nonmagnetic metal layer 2, the second nonmagnetic metal layer 3, the first ferromagnetic layer 4, the nonmagnetic spacer layer 5, the second ferromagnetic layer 6, the cap nonmagnetic metal layer 7, and the contact metal layer 8 are sequentially deposited on the substrate 1. The nonmagnetic spacer layer 5 is formed in a method that the first insertion layer 5A, the nonmagnetic material 5B, and the second insertion layer 5C are deposited on the first ferromagnetic layer 4.

The deposition is performed by a sputtering which is a well-known technology. In the example, each of the layers is formed at room temperature by using an ultra-high vacuum sputtering machine with a sputtering target made of composition materials of each of the layers. However, two or more sputtering targets can be simultaneously used. That is, an alloy film of A and B which are different materials can be formed or a composition of the material of each of the layers can be adjusted, by co-sputtering two (or more) targets of A and B. The first ferromagnetic layer 4 is annealed at 500° C. after film deposition. The second ferromagnetic layer 6 is annealed at 450° C. after film deposition. The magnetoresistive effect element is microfabricated to have a shape of an extent of being capable of evaluating magnetoresistance characteristics, by photolithography, electron beam lithography, or Ar ion milling. Examples of a method of producing $Co_2MnSi$ and the like using a sputtering machine are disclosed in U.S. Patent Publication No. 2007/0230070, U.S. Patent Publication No. 2013/0229895, U.S. Patent Publication No. 2014/0063648, U.S. Patent Publication No. 2007/0211391, U.S. Patent Publication No. 2013/0335847, and the like.

As described above, according to the magnetoresistive effect element of the present disclosure, it is possible to improve temperature dependence and to obtain a large MR ratio at room temperature. Since a magnetic head, a sensor, a high frequency filter, or an oscillation element including any of the above-described magnetoresistive effect elements has a large magnetoresistive effect, it is possible to exhibit excellent characteristics.

As the crystal structure of the first insertion layer and/or the second insertion layer, it is possible to obtain a stable cubic crystal structure. As a result, the nonmagnetic spacer layer, and the first ferromagnetic layer and/or second ferromagnetic layer can be stacked with higher crystal quality. Thus, a larger magnetoresistive effect is exhibited. The nonmagnetic spacer layer may include at least one metal element of Ag, Au, Cu, Cr, V, Al, W, and Pt. In this case, it is possible to obtain a high magnetoresistance ratio. The nonmagnetic spacer layer may be made of any one of MgO, $Al_2O_3$, $TiO_2$, or $HfO_2$, and may be a tunnel barrier having a spinel structure. In this case, it is possible to obtain a high magnetoresistance ratio. The tunnel barrier having the spinel structure may be made of $MgAl_2O_4$, $ZnAl_2O_4$, $\gamma$-$Al_2O_3$, or $MgGa_2O_4$, or may have a mixed crystal structure in which one of $MgAl_2O_4$, $ZnAl_2O_4$, $\gamma$-$Al_2O_3$, or $MgGa_2O_4$ is provided as the main component. In this case, even in a case using MgO, $Al_2O_3$, $TiO_2$, or $HfO_2$, it is possible to obtain a larger magnetoresistance ratio.

Next, an effect in a case using $Fe_2TiSi$ will be considered.

FIG. 8 is a table illustrating a relationship between the material of the magnetoresistive effect element and the MR ratio.

As described above, the magnetoresistive effect element having a structure illustrated in FIG. 1 includes the first ferromagnetic layer 4, the first insertion layer 5A, the nonmagnetic material 5B, the second insertion layer 5C, and the second ferromagnetic layer 6. The material and the thickness (indicated in parentheses) in experimental examples are as follows.

Example 1

Contact metal layer 8: Ru (5 nm)
Cap nonmagnetic metal layer 7: Ag (5 nm)

Second ferromagnetic layer 6: Fe (6 nm)
Second insertion layer 5C: $Fe_2TiSi$ (X nm)
Nonmagnetic material 5B: Ag (2 nm)
First insertion layer 5A: $Fe_2TiSi$ (X nm)
First ferromagnetic layer 4: Fe (10 nm)
Second nonmagnetic metal layer 3: Ag (50 nm)
First nonmagnetic metal layer 2: Cr (20 nm)
Substrate 1: MgO (0.5 mm)

The thickness of each of the first insertion layer 5A and the second insertion layer 5C is set as X nm. Example 1-1 (case of X=1), Example 1-2 (case of X=3), and Example 1-3 (case of X=5) are defined in accordance with the value of X.

Comparative Example 1

Contact metal layer 8: Ru (5 nm)
Cap nonmagnetic metal layer 7: Ag (5 nm)
Second ferromagnetic layer 6: Fe (6 nm)
Second insertion layer 5C: none
Nonmagnetic material 5B: Ag (2 nm)
First insertion layer 5A: none
First ferromagnetic layer 4: Fe (10 nm)
Second nonmagnetic metal layer 3: Ag (50 nm)
First nonmagnetic metal layer 2: Cr (20 nm)
Substrate 1: MgO (0.5 mm)

Comparative Example 2

Contact metal layer 8: Ru (5 nm)
Cap nonmagnetic metal layer 7: Ag (5 nm)
Second ferromagnetic layer 6: $Co_2MnSi$ (6 nm)
Second insertion layer 5C: none
Nonmagnetic material 5B: Ag (2 nm)
First insertion layer 5A: none
First ferromagnetic layer 4: $Co_2MnSi$ (10 nm)
Second nonmagnetic metal layer 3: Ag (50 nm)
First nonmagnetic metal layer 2: Cr (20 nm)
Substrate 1: MgO (0.5 mm)

Comparative Example 3

Contact metal layer 8: Ru (5 nm)
Cap nonmagnetic metal layer 7: Ag (5 nm)
Second ferromagnetic layer 6: $Co_2MnSi$ (6 nm)
Second insertion layer 5C: none
Nonmagnetic material 5B: MgO (2 nm)
First insertion layer 5A: none
First ferromagnetic layer 4: $Co_2MnSi$ (10 nm)
Second nonmagnetic metal layer 3: Ag (50 nm)
First nonmagnetic metal layer 2: Cr (20 nm)
Substrate 1: MgO (0.5 mm)

In Comparative Example 1 to Comparative Example 3, the first insertion layer 5A and the second insertion layer 5C are not provided. In Comparative Example 2, the materials of the first and second ferromagnetic layers are different from those in Comparative Example 1. In Comparative Example 3, the material of the nonmagnetic material 5B is different from that in Comparative Example 2.

Example 2

Contact metal layer 8: Ru (5 nm)
Cap nonmagnetic metal layer 7: Ag (5 nm)
Second ferromagnetic layer 6: $Co_2MnSi$ (6 nm)
Second insertion layer 5C: $Fe_2TiSi$ (1 nm)
Nonmagnetic material 5B: metal material M* (2 nm)
First insertion layer 5A: $Fe_2TiSi$ (1 nm)
First ferromagnetic layer 4: $Co_2MnSi$ (10 nm)
Second nonmagnetic metal layer 3: Ag (50 nm)
First nonmagnetic metal layer 2: Cr (20 nm)
Substrate 1: MgO (0.5 mm)

In Example 2, the metal material M* of the nonmagnetic material 5B is changed. Example 2-1 (case where the metal material M* is Ag), Example 2-2 (case where the metal material M* is Au), Example 2-3 (case where the metal material M* is Cu), Example 2-4 (case where the metal material M* is Cr), Example 2-5 (case where the metal material M* is Al), Example 2-6 (case where the metal material M* is Pt), Example 2-7 (case where the metal material M* is V), and Example 2-8 (case where the metal material M* is W) are defined in accordance with the metal material M*.

Example 3

Contact metal layer 8: Ru (5 nm)
Cap nonmagnetic metal layer 7: Ag (5 nm)
Second ferromagnetic layer 6: $Co_2MnSi$ (6 nm)
Second insertion layer 5C: $Fe_2TiSi$ (1 nm)
Nonmagnetic material 5B: metal oxide material O* (2 nm)
First insertion layer 5A: $Fe_2TiSi$ (1 nm)
First ferromagnetic layer 4: $Co_2MnSi$ (10 nm)
Second nonmagnetic metal layer 3: Ag (50 nm)
First nonmagnetic metal layer 2: Cr (20 nm)
Substrate 1: MgO (0.5 mm)

In Example 3, the metal oxide material O* of the nonmagnetic material 5B is changed. Example 3-1 (case where the metal oxide material O* is MgO), Example 3-2 (case where the metal oxide material O* is $TiO_2$), and Example 3-3 (case where the metal oxide material O* is $HfO_2$) are defined in accordance with the metal oxide material O*. All Ti, Zr, and Hf belong to transition metal elements of Group 4 and have similar chemical properties.

Example 4

Contact metal layer 8: Ru (5 nm)
Cap nonmagnetic metal layer 7: Ag (5 nm)
Second ferromagnetic layer 6: $Co_2MnSi$ (6 nm)
Second insertion layer 5C: $Fe_2TiSi$ (1 nm)
Nonmagnetic material 5B: Group 13 metal-containing oxide material C* (2 nm)
First insertion layer 5A: $Fe_2TiSi$ (1 nm)
First ferromagnetic layer 4: $Co_2MnSi$ (10 nm)
Second nonmagnetic metal layer 3: Ag (50 nm)
First nonmagnetic metal layer 2: Cr (20 nm)
Substrate 1: MgO (0.5 mm)

In Example 4, the Group 13 metal-containing oxide material C* of the nonmagnetic material 5B is changed. Example 4-1 (case where the Group 13 metal-containing oxide material C* is $MgAl_2O_4$), Example 4-2 (case where the Group 13 metal-containing oxide material C* is $ZnAl_2O_4$), Example 4-3 (case where the Group 13 metal-containing oxide material C* is $\gamma$-$Al_2O_3$), and Example 4-4 (case where the Group 13 metal-containing oxide material C* is $MgGa_2O_4$) are defined in accordance with the Group 13 metal-containing oxide material C*.

In FIG. 8, lattice mismatch ratios R1, R2, and R3 between the layers are shown along with the MR ratios and evaluations. The lattice constant of each material is set as follows.

Second ferromagnetic layer 6: lattice constant-corresponding reference value aF

Second insertion layer 5C: lattice constant-corresponding reference value aI

Nonmagnetic material 5B: lattice constant-corresponding reference value aN

First insertion layer 5A: lattice constant-corresponding reference value aI

First ferromagnetic layer 4: lattice constant-corresponding reference value aF

The lattice mismatch ratio satisfies ((A2−A1)/A1)×100 (%). A1 indicates one lattice constant-corresponding reference value. A2 indicates the other lattice constant-corresponding reference value. The lattice constant-corresponding reference value means n times (n is a positive integer) of the lattice constant a or 1/n times (n is a positive integer) of the lattice constant a when crystal planes of the layers are aligned in a state of being inclined by 0 degree. The lattice constant-corresponding reference value means a value obtained by multiplying a by the square root of 2 when crystal planes of the layers are aligned in a state of being inclined by 45 degrees. In short, in a case where the adjacent layers are in contact with each other, in a case where the distance D1 between atoms in the XY plane of each layer and the distance D2 between atoms in the XY plane of each layer are provided, the lattice mismatch ratio is obtained in a case where a combination in which a difference between the distances D1 and D2 is the minimum.

Specifically, definitions of the lattice mismatch ratios R1, R2, and R3 are as follows.

$R1=((aN-aF)/aF)\times 100(\%)$ $R2=((aI-aF)/aF)\times 100(\%)$ $R3=((aN-aI)/aI)\times 100(\%)$ Definitions of Evaluations A and B are as follows.

Evaluation A: a lattice mismatching ratio with respect to R1 is improved, and the MR ratio is improved in comparison to that in Comparative Example 1

Evaluation B: the MR ratio is improved in comparison to that in Comparative Example 1

In a case where the Fermi level moves to the center of the electronic band, for example, by using the Heusler alloy, the MR ratio is also improved by an influence of the movement of the Feinii level.

Considering Example 1 to Example 4 as described above, the MR ratio in Example 1 is higher than that in Comparative Example 1. Thus, it is understood that the MR ratio is increased (MR ratio is 1.9% to 2.8%) by using the insertion layer. In a case of Example 1, Evaluation B is obtained. It is considered that the reason is that an interfacial property of the electronic band between the first (second) ferromagnetic layer 4(6) and nonmagnetic material 5B is improved by Fe$_2$TiSi which is the material of the first (second) insertion layer 5A(5C).

The MR ratio in Example 2 is higher than that in Comparative Example 2. Thus, it is understood that the MR ratio is increased (MR ratio is 10.1% to 19.1%) by using the insertion layer. It is considered that the reason is as follows. In a case of Evaluation A, if Fe$_2$TiSi is bonded to the Heusler alloy, the Fermi level of half-metal of the Heusler alloy moves to the center of the electronic band thereof, and thus it is possible to exhibit half-metal characteristics or to reduce temperature dependence of the output, in addition to improvement of the lattice matching ratio. In a case of Evaluation B, the reason is as follows. If Fe$_2$TiSi is bonded to the Heusler alloy, the Fermi level of half-metal of the Heusler alloy moves to the center of the electronic band thereof, and thus it is possible to exhibit half-metal characteristics or to reduce temperature dependence of the output, in addition to improvement of the lattice matching ratio.

The MR ratio in Example 3 is higher than those in Example 2 and Comparative Example 3. Thus, it is understood that the MR ratio is increased (MR ratio is 38% to 73%) by using the nonmagnetic material of metal oxide in addition to the insertion layer. It is considered that the reason is as follows. In a case of Evaluation A, if Fe$_2$TiSi is bonded to the Heusler alloy, the Fermi level of half-metal of the Heusler alloy moves to the center of the electronic band thereof, and thus it is possible to exhibit half-metal characteristics or to reduce temperature dependence of the output, in addition to improvement of the lattice matching ratio. In a case of Evaluation B, the reason is as follows. If Fe$_2$TiSi is bonded to the Heusler alloy, the Fermi level of half-metal of the Heusler alloy moves to the center of the electronic band thereof, and thus it is possible to exhibit half-metal characteristics or to reduce temperature dependence of the output, in addition to improvement of the lattice matching ratio.

The MR ratio in Example 4 is higher than that in Example 3. Thus, it is understood that the MR ratio is increased (MR ratio is 39% to 74%) by changing the nonmagnetic material 5B to the Group 13 metal-containing oxide material. It is considered that the reason is as follows. In a case of Evaluation A, if Fe$_2$TiSi is bonded to the Heusler alloy, the Fermi level of half-metal of the Heusler alloy moves to the center of the electronic band thereof, and thus it is possible to exhibit half-metal characteristics or to reduce temperature dependence of the output, in addition to improvement of the lattice matching ratio. In a case of Evaluation B, the reason is as follows. If Fe$_2$TiSi is bonded to the Heusler alloy, the Fermi level of half-metal of the Heusler alloy moves to the center of the electronic band thereof, and thus it is possible to exhibit half-metal characteristics or to reduce temperature dependence of the output, in addition to improvement of the lattice matching ratio.

Comparing Example 1-1 to Example 1-3, as the insertion layer becomes thinner, the MR ratio increases. In a case where the thickness of each insertion layer is greater than 3 nm, the MR ratio is lowered. This is because spin diffusion is caused. The thickness of the first insertion layer is preferably equal to or greater than 1 nm. As the thickness of the first insertion layer becomes thicker, the MR ratio increases because the thickness of the first insertion layer influences the MR ratio. In a case where the thickness is greater than 3 nm, the MR ratio is lowered. This is because spin diffusion is caused. The thickness of the second insertion layer is preferably equal to or greater than 1 nm. As the thickness of the second insertion layer becomes thicker, the MR ratio increases because the thickness of the second insertion layer influences the MR ratio. In a case where the thickness is greater than 3 nm, the MR ratio is lowered. This is because spin diffusion is caused.

Comparing Example 2-1 to Example 2-8, it is understood that the MR ratio is the maximum in a case of using Ag as the nonmagnetic material 5B, but the effect of increasing the MR ratio is obtained even by using other kinds of metal.

Comparing Example 3-1 to Example 3-3, it is understood that the MR ratio is the maximum in a case of using MgO as the nonmagnetic material 5B, but the effect of increasing the MR ratio is obtained even by using other metal oxides.

Comparing Example 4-1 to Example 4-4, it is understood that the MR ratio is the maximum in a case of using MgAl$_2$O$_4$ as the nonmagnetic material 5B, but the effect of increasing the MR ratio is obtained even by using other Group 13 metal-containing oxide materials.

FIG. 9 is a table illustrating the lattice constants of various materials. Au, Cu, Cr, Al, Pt, V, W, $Fe_2TiSi$, Fe, MgO, $TiO_2$, $HfO_2$, $MgAl_2O_4$, $ZnAl_2O_4$, $\gamma-Al_2O_3$, or $MgGa_2O_4$ can be used as the nonmagnetic material 5B, in addition to Ag.

FIG. 10 is a table illustrating the lattice constants of other various materials. $Co_2MnSi$, $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGa0.5Sn0.5$, $Co_2FeGeGa$, $Fe_2TiSi$, or the like can be used for the first ferromagnetic layer 4 and the second ferromagnetic layer 6. In a case where the ferromagnetic layer includes the common element with the adjacent insertion layer, it is considered that the amount of the element moving is reduced.

FIG. 11 is a table illustrating the relationship between the material of the magnetoresistive effect element and the MR ratio.

In the above-described structure in FIG. 2, the third insertion layer 40C is provided on a surface of the first ferromagnetic layer, which is opposite to a surface thereof in contact with the nonmagnetic spacer layer, and the fourth insertion layer 60C is provided on a surface of the second ferromagnetic layer, which is opposite to a surface thereof in contact with the nonmagnetic spacer layer, instead of the first insertion layer and the second insertion layer in the structure in FIG. 1. The third insertion layer and the fourth insertion layer are made of $Fe_2TiSi$.

The material and the thickness (indicated in parentheses) in Examples 5 to 8 are as follows.

Example 5

Contact metal layer 8: Ru (5 nm)
Cap nonmagnetic metal layer 7: Ag (5 nm)
Fourth insertion layer 60C: $Fe_2TiSi$ (X nm)
Second ferromagnetic layer 6: Fe (6 nm)
Nonmagnetic material 5(5B): Ag (2 nm)
First ferromagnetic layer 4: Fe (10 nm)
Third insertion layer 40C: $Fe_2TiSi$ (X nm)
Second nonmagnetic metal layer 3: Ag (50 nm)
First nonmagnetic metal layer 2: Cr (20 nm)
Substrate 1: MgO (0.5 mm)

The thickness of each of the third insertion layer 40C and the fourth insertion layer 60C is set as X nm. Example 5-1 (case of X=0.2), Example 5-2 (case of X=0.5), Example 5-3 (case of X=1), Example 5-4 (case of X=2), and Example 5-5 (case of X=3) are defined in accordance with the value of X.

Example 6

Contact metal layer 8: Ru (5 nm)
Cap nonmagnetic metal layer 7: Ag (5 nm)
Fourth insertion layer 60C: $Fe_2TiSi$ (2 nm)
Second ferromagnetic layer 6: $Co_2MnSi$ (6 nm)
Nonmagnetic material 5(5B): metal material M* (2 nm)
First ferromagnetic layer 4: $Co_2MnSi$ (10 nm)
Third insertion layer 40C: $Fe_2TiSi$ (2 nm)
Second nonmagnetic metal layer 3: Ag (50 nm)
First nonmagnetic metal layer 2: Cr (20 nm)
Substrate 1: MgO (0.5 mm)

In Example 6, the metal material M* of the nonmagnetic material 5B is changed. Example 6-1 (case where the metal material M* is Ag), Example 6-2 (case where the metal material M* is Au), Example 6-3 (case where the metal material M* is Cu), Example 6-4 (case where the metal material M* is Cr), Example 6-5 (case where the metal material M* is Al), Example 6-6 (case where the metal material M* is Pt), Example 6-7 (case where the metal material M* is V), and Example 6-8 (case where the metal material M* is W) are defined in accordance with the metal material M*.

Example 7

Contact metal layer 8: Ru (5 nm)
Cap nonmagnetic metal layer 7: Ag (5 nm)
Fourth insertion layer 60C: $Fe_2TiSi$ (2 nm)
Second ferromagnetic layer 6: $Co_2MnSi$ (6 nm)
Nonmagnetic material 5(5B): metal oxide material O* (2 nm)
First ferromagnetic layer 4: $Co_2MnSi$ (10 nm)
Third insertion layer 40C: $Fe_2TiSi$ (2 nm)
Second nonmagnetic metal layer 3: Ag (50 nm)
First nonmagnetic metal layer 2: Cr (20 nm)
Substrate 1: MgO (0.5 mm)

In Example 7, the metal oxide material O* of the nonmagnetic material 5B is changed. Example 7-1 (case where the metal oxide material O* is MgO), Example 7-2 (case where the metal oxide material O* is $TiO_2$), and Example 7-3 (case where the metal oxide material O* is $HfO_2$) are defined in accordance with the metal oxide material O*. All Ti, Zr, and Hf belong to transition metal elements of Group 4 and have similar chemical properties.

Example 8

Contact metal layer 8: Ru (5 nm)
Cap nonmagnetic metal layer 7: Ag (5 nm)
Fourth insertion layer 60C: $Fe_2TiSi$ (2 nm)
Second ferromagnetic layer 6: $Co_2MnSi$ (6 nm)
Nonmagnetic material 5(5B): Group 13 metal-containing oxide material C* (2 nm)
First ferromagnetic layer 4: $Co_2MnSi$ (10 nm)
Third insertion layer 40C: $Fe_2TiSi$ (2 nm)
Second nonmagnetic metal layer 3: Ag (50 nm)
First nonmagnetic metal layer 2: Cr (20 nm)
Substrate 1: MgO (0.5 mm)

In Example 8, the Group 13 metal-containing oxide material C* of the nonmagnetic material 5B is changed. Example 8-1 (case where the Group 13 metal-containing oxide material C* is $MgAl_2O_4$), Example 8-2 (case where the Group 13 metal-containing oxide material C* is $ZnAl_2O_4$), Example 8-3 (case where the Group 13 metal-containing oxide material C* is $\gamma-Al_2O_3$), and Example 8-4 (case where the Group 13 metal-containing oxide material C* is $MgGa_2O_4$) are defined in accordance with the Group 13 metal-containing oxide material C*.

FIG. 12 is a table illustrating the lattice constants and the lattice mismatch ratios of the various materials.

In Example 5 to Example 8, the insertion layer $Fe_2TiSi$ is in contact with the ferromagnetic layer. As described above, $Co_2MnSi$, $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGa0.5Sn0.5$, $Co_2FeGeGa$, $Fe_2TiSi$, or the like can be used as the material of the ferromagnetic layer. In a case of the materials, it is possible to reduce the absolute value of the lattice mismatch ratio in a range of 0.0% to 4.2%.

In FIGS. 11 and 12, the lattice mismatch ratio R4 between the layers is described.

Fourth insertion layer 60C: lattice constant-corresponding reference value aI
Second ferromagnetic layer 6: lattice constant-corresponding reference value aF First ferromagnetic layer 4: lattice constant-corresponding reference value aF Third insertion layer 40C: lattice constant-corresponding reference value aI The lattice mismatch ratio satisfies $((A2-A1)/A1) \times 100$ (%). A1 indicates one lattice constant-corresponding reference value. A2 indicates the other lattice constant-corresponding reference value. The lattice constant-corresponding reference value means n times (n is a positive integer) of the lattice constant a or 1/n times (n is a positive integer) of the lattice constant a when crystal planes of the layers are aligned in a state of being inclined by 0 degree. The lattice constant-corresponding reference value means a value obtained by multiplying a by the square root of 2 when crystal planes of the layers are aligned in a state of being inclined by 45 degrees. In short, in a case where the adjacent layers are in contact with each other, in a case where the distance D1 between atoms in the XY plane of each layer and the distance D2 between atoms in the XY plane of each layer are provided, the lattice mismatch ratio is obtained in a case where a combination in which a difference between the distances D1 and D2 is the minimum.

Specifically, the definition of the lattice mismatch ratio R4 is as follows.

$$R4 = ((aI - aF)/aF) \times 100(\%)$$

As described above, considering Example 5 to Example 8 illustrated in FIG. 11, the MR ratio in Example 5 is higher than that in Comparative Example 1. Thus, it is understood that the MR ratio is increased (MR ratio is 1.7% to 2.6%) by using the insertion layer. As the thickness of the third insertion layer becomes thicker, the MR ratio increases because the thickness of the third insertion layer influences the MR ratio. The thickness of the third insertion layer is preferably equal to or greater than 1 nm. As the thickness of the fourth insertion layer becomes thicker, the MR ratio increases because the thickness of the fourth insertion layer influences the MR ratio. The thickness of the fourth insertion layer is preferably equal to or greater than 1 nm.

The MR ratio in Example 6 is higher than that in Comparative Example 2. Thus, it is understood that the MR ratio is increased (MR ratio is 9.0% to 15.1%) by using the insertion layer. The material ($Co_2MnSi$) of the first ferromagnetic layer 4 influences the MR ratio. The material ($Co_2MnSi$) of the second ferromagnetic layer 6 influences the MR ratio. The reason of the material increasing the MR ratio in comparison to Fe is that the material has large spin polarizability.

The MR ratio in Example 7 is higher than those in Example 6 and Comparative Example 3. Thus, it is understood that the MR ratio is increased (MR ratio is 40% to 52%) by using the nonmagnetic material of metal oxide in addition to the insertion layer.

The MR ratio in Example 8 except Example 8-3 (in which the nonmagnetic material 5B is alumina) is higher than that in Example 7. Thus, it is understood that the MR ratio is increased (MR ratio is 43% to 74%) by changing the nonmagnetic material 5B to the Group 13 metal-containing oxide material.

The nonmagnetic materials described in Example 7 and Example 8 are oxides. In a case of such materials, the MR ratio can be increased in comparison to Ag. This is because a coherent tunnel effect is obtained in a case of oxides such as MgO, $TiO_2$, $HfO_2$, $MgAl_2O_4$, $ZnAl_2O_4$, $\gamma$-$Al_2O_3$, and $MgGa_2O_4$.

Comparing Example 5-1 to Example 5-5, as the insertion layer becomes thinner, the MR ratio increases.

Comparing Example 6-1 to Example 6-8, it is understood that the MR ratio is the maximum in a case of using Au as the nonmagnetic material 5B, but the effect of increasing the MR ratio is obtained even by using other kinds of metal.

Comparing Example 7-1 to Example 7-3, it is understood that the MR ratio is the maximum in a case of using MgO as the nonmagnetic material 5B, but the effect of increasing the MR ratio is obtained even by using other metal oxides.

Comparing Example 8-1 to Example 8-4, it is understood that the MR ratio is the maximum in a case of using $MgAl_2O_4$ as the nonmagnetic material 5B, but the effect of increasing the MR ratio is obtained even by using other Group 13 metal-containing oxide materials.

FIG. 13 is a table illustrating the relationship between the material of the magnetoresistive effect element and the MR ratio. In the above-described structure in FIG. 3, the magnetoresistive effect element does not include the first insertion layer 5A and the second insertion layer 5C in the structure in FIG. 1, and includes the first Heusler layer 60A in contact with the nonmagnetic spacer layer 5(5B) and the second Heusler layer 60B which is in contact with the first Heusler layer 60A and has a composition different from that of the first Heusler layer 60A, as the second ferromagnetic layer 6. Other materials and structures are the same as those described in the first embodiment.

The material and the thickness (indicated in parentheses) in Examples 9 to 13 are as follows.

Example 9

Contact metal layer 8: Ru (5 nm)
Cap nonmagnetic metal layer 7: Ag (5 nm)
Second Heusler layer 60B: NiMnSb (3 nm)
First Heusler layer 60A: $Co_2MnSi$ (3 nm)
Nonmagnetic material 5B: Ag (2 nm)
First ferromagnetic layer 4: Fe (10 nm)
Second nonmagnetic metal layer 3: Ag (50 nm)
First nonmagnetic metal layer 2: Cr (20 nm)
Substrate 1: MgO (0.5 mm)

Example 10

Contact metal layer 8: Ru (5 nm)
Cap nonmagnetic metal layer 7: Ag (5 nm)
Second Heusler layer 60B: NiMnSb (3 nm)
First Heusler layer 60A: $Co_2FeSi$ (3 nm)
Nonmagnetic material 5B: Ag (2 nm)
First ferromagnetic layer 4: Fe (10 nm)
Second nonmagnetic metal layer 3: Ag (50 nm)
First nonmagnetic metal layer 2: Cr (20 nm)
Substrate 1: MgO (0.5 mm)

Example 11

Contact metal layer 8: Ru (5 nm)
Cap nonmagnetic metal layer 7: Ag (5 nm)
Second Heusler layer 60B: $Co_2MnSi$ (3 nm)
First Heusler layer 60A: $Co_2FeSi$ (3 nm)
Nonmagnetic material 5(5B): metal material M* (2 nm)
First ferromagnetic layer 4: Fe (10 nm)
Second nonmagnetic metal layer 3: Ag (50 nm)
First nonmagnetic metal layer 2: Cr (20 nm)
Substrate 1: MgO (0.5 mm)

In Example 11, the metal material M* of the nonmagnetic material 5B is changed. Example 11-1 (case where the metal material M* is Ag), Example 11-2 (case where the metal material M* is Au), Example 11-3 (case where the metal material M* is Cu), Example 11-4 (case where the metal material M* is Cr), Example 11-5 (case where the metal material M* is Al), Example 11-6 (case where the metal material M* is Pt), Example 11-7 (case where the metal material M* is V), and Example 11-8 (case where the metal material M* is W) are defined in accordance with the metal material M*.

Example 12

Contact metal layer 8: Ru (5 nm)
Cap nonmagnetic metal layer 7: Ag (5 nm)
Second Heusler layer 60B: $Co_2MnSi$ (3 nm)
First Heusler layer 60A: $Co_2FeSi$ (nm)
Nonmagnetic material 5(5B): metal oxide material O* (2 nm)
First ferromagnetic layer 4: Fe (10 nm)
Second nonmagnetic metal layer 3: Ag (50 nm)
First nonmagnetic metal layer 2: Cr (20 nm)
Substrate 1: MgO (0.5 mm)

In Example 12, the metal oxide material O* of the nonmagnetic material 5B is changed. Example 12-1 (case where the metal oxide material O* is MgO), Example 12-2 (case where the metal oxide material O* is $TiO_2$), and Example 12-3 (case where the metal oxide material O* is $HfO_2$) are defined in accordance with the metal oxide material O*. All Ti, Zr, and Hf belong to transition metal elements of Group 4 and have similar chemical properties.

Example 13

Contact metal layer 8: Ru (5 nm)
Cap nonmagnetic metal layer 7: Ag (5 nm)
Second Heusler layer 60B: $Co_2MnSi$ (3 nm)
First Heusler layer 60A: $Co_2FeSi$ (3 nm)
Nonmagnetic material 5(5B): Group 13 metal-containing oxide material C* (2 nm)
First ferromagnetic layer 4: Fe (10 nm)
Second nonmagnetic metal layer 3: Ag (50 nm)
First nonmagnetic metal layer 2: Cr (20 nm)
Substrate 1: MgO (0.5 mm)

In Example 13, the Group 13 metal-containing oxide material C* of the nonmagnetic material 5B is changed. Example 13-1 (case where the Group 13 metal-containing oxide material C* is $MgAl_2O_4$), Example 13-2 (case where the Group 13 metal-containing oxide material C* is $ZnAl_2O_4$), Example 13-3 (case where the Group 13 metal-containing oxide material C* is $\gamma$-$Al_2O_3$), and Example 13-4 (case where the Group 13 metal-containing oxide material C* is $MgGa_2O_4$) are defined in accordance with the Group 13 metal-containing oxide material C*.

Comparative Example 4

In Comparative Example 4, the second ferromagnetic layer 6 in Comparative Example 1 is changed from Fe (6 nm) to $Co_2MnSi$ (6 nm). Other components are the same as those in Comparative Example 1.

Comparative Example 5

In Comparative Example 5, the nonmagnetic material 5B in Comparative Example 4 is changed from Ag to MgO (2 nm). Other components are the same as those in Comparative Example 4.

As described above, considering Example 9 to Example 13 illustrated in FIG. 13, the MR ratio in Example 9 is higher than that in Comparative Example 4 in which one kind of Heusler layer is provided. Thus, it is understood that the MR ratio is increased (MR ratio is 4.5%) by using two kinds of Heusler layers as the ferromagnetic layer 6. It is considered that the reason is as follows. Regarding the first Heusler layer 60A and the second Heusler layer 60B, the first Heusler layer 60A and the second Heusler layer 60B in which one surface has a similar crystal structure are in contact with each other. Thus, the electronic band of the ferromagnetic layer becomes stable easier than that when the ferromagnetic layer is made of a single-layer Heusler alloy. Thus, the temperature dependence is improved and the magnetoresistance ratio at room temperature increases.

The MR ratio in Example 10 is higher than that in Example 9. Thus, it is understood that the MR ratio is increased (MR ratio is 5.5%) by using $Co_2FeSi$ changed from $Co_2MnSi$, as the material of the Heusler layer. It is considered that the reason is as follows. $Co_2FeSi$ has a high Curie temperature among Co-based Heusler substances. Thus, even though annealing process at a high temperature is performed in the process of manufacturing a magnetoresistive effect element, it is possible to suppress the decrease of the magnetoresistance ratio and to obtain a high magnetoresistance ratio even at room temperature.

The MR ratio in Example 11 is higher than that in Comparative Example 4. Thus, it is understood that MR ratio is increased (MR ratio is 6.2% to 9.5%) in comparison to that in Comparative Example 4, even by changing the nonmagnetic material 5B to another kind of metal. It is considered that the reason is as follows. $Co_2MnSi$ and $Co_2FeSi$ withstand high-temperature annealing at 400° C. However, in a case where performing annealing at a higher temperature is needed, it is considered that Mn of $Co_2MnSi$ may firstly diffused when both $Co_2MnSi$ and $Co_2FeSi$ are compared to each other. In this case, in a case where $Co_2MnSi$ is in contact with the nonmagnetic spacer layer 5, Mn is diffused into the nonmagnetic spacer layer. As a result, deterioration of the magnetoresistive effect is expected. Therefore, if the first Heusler layer 60A is made of $Co_2FeSi$ and the second Heusler layer 60B is made of $Co_2MnSi$, it is possible to prevent an occurrence of a situation in which Mn of the second Heusler layer 60B is diffused into the nonmagnetic spacer layer 5. That is, $Co_2FeSi$ of the first Heusler layer 60A functions as a Mn diffusion prevention layer.

The MR ratio in Example 12 is higher than those in Example 11 and Comparative Example 5. Thus, it is understood that the MR ratio is increased (MR ratio is 31% to 35%) by using the nonmagnetic material 5B of metal oxide in addition to the insertion layer. It is considered that the reason is that the coherent tunnel effect is obtained.

Regarding the MR ratio (MR ratio is 25% to 38%) in Example 13, in Examples 13-1 and 13-2 except Example 13-3 (in which the nonmagnetic material 5B is alumina) and Example 13-4 (in which the nonmagnetic material 5B is $MgGa_2O_4$), the MR ratio is higher than that in Example 12. Thus, it is understood that the MR ratio is increased by changing the nonmagnetic material 5B to the Group 13 metal-containing oxide material. It is considered that the reason is that the lattice matching property with $Co_2FeSi$ as the first Heusler layer in Examples 13-1 (in which the nonmagnetic material 5B is $MgAl_2O_4$) and 13-2 (in which the nonmagnetic material 5B is $ZnAl_2O_4$) is more favorable than that in Example 13-3 (in which the nonmagnetic material 5B is alumina) and Example 13-4 (in which the nonmagnetic material 5B is $MgGa_2O_4$). In a case of Examples 13-3 and 13-4, the MR ratio higher than that in Comparative Example 5 is also obtained.

Comparing Example 11-1 to Example 11-8, it is understood that the MR ratio is the maximum in a case of using Au as the nonmagnetic material 5B, but the effect of increasing the MR ratio is obtained even by using other kinds of metal.

Comparing Example 12-1 to Example 12-3, it is understood that the MR ratio is the maximum in a case of using MgO as the nonmagnetic material 5B, but the effect of increasing the MR ratio is obtained even by using other metal oxides.

Comparing Example 13-1 to Example 13-4, it is understood that the MR ratio is the maximum in a case of using $MgAl_2O_4$ as the nonmagnetic material 5B, but the effect of increasing the MR ratio is obtained even by using other Group 13 metal-containing oxide materials.

From the above-described experiments, the following is considered. Even though materials other than Fe or $Co_2MnSi$ are used as the materials of the first ferromagnetic layer 4 and the second ferromagnetic layer 6, the effect of increasing the MR ratio is obtained when the materials have large spin polarizability as described in FIG. 10.

As described above, in Example 1 to Example 4, the magnetoresistive effect element includes the first ferromagnetic layer 4 as the fixed magnetization layer, the second ferromagnetic layer 6 as the free magnetization layer, and the nonmagnetic spacer layer (nonmagnetic material 5B) provided between the first ferromagnetic layer 4 and the second ferromagnetic layer 6. The nonmagnetic spacer layer includes at least one of the first insertion layer 5A provided under the nonmagnetic spacer layer and the second insertion layer 5C provided over the nonmagnetic spacer layer. The first insertion layer 5A and the second insertion layer 5C are made of $Fe_2TiSi$. In a case of such a structure, the difference of the lattice constant of the first insertion layer 5A and the second insertion layer 5C from the nonmagnetic material 5B and the ferromagnetic layer (first ferromagnetic layer 4 or second ferromagnetic layer 6) is sufficiently small. Thus, the first insertion layer 5A and the second insertion layer 5C function as a buffer layer in which distortion at an interface is alleviated, and the MR ratio is high. In the structure illustrated in FIG. 1, it is considered that this effect is obtained so long as any one of the first insertion layer 5A and the second insertion layer 5C is provided, based on the principle. As described above, even though the type of the nonmagnetic material, or the material or the thickness of the insertion layer is changed, the effect of increasing the MR ratio is obtained. The thickness of each of the first insertion layer 5A and the second insertion layer 5C is preferably equal to or smaller than 3 nm. The reason is that, if the thickness thereof is greater than 3 nm, spin diffusion occurs, and the MR ratio is reduced.

In Example 5 to Example 8, the magnetoresistive element includes the first ferromagnetic layer 4 as the fixed magnetization layer, the second ferromagnetic layer 6 as the free magnetization layer, the nonmagnetic spacer layer (nonmagnetic material 5B) provided between the first ferromagnetic layer and the second ferromagnetic layer, the third insertion layer 40C provided on the surface of the first ferromagnetic layer, which is opposite to a surface thereof in contact with the nonmagnetic spacer layer, and the fourth insertion layer 60C provided on the surface of the second ferromagnetic layer, which is opposite to a surface thereof in contact with the nonmagnetic spacer layer. The third insertion layer and the fourth insertion layer are made of $Fe_2TiSi$. In a case of such a structure, a stacked structure in which the first ferromagnetic layer 4 is in contact with the third insertion layer 40C and the second ferromagnetic layer 6 is in contact with the fourth insertion layer 60C is obtained. Thus, since the one surface of first ferromagnetic layer 4 is in contact with the third insertion layer 40C having a favorable lattice matching property and one surface of the second ferromagnetic layer 6 is in contact with the fourth insertion layer 60C having a favorable lattice matching property, the electronic band becomes stable easier than that when a Heusler alloy which has a single layer and does not have the insertion layer is used. Accordingly, temperature dependence is improved and the magnetoresistance ratio at room temperature increases. In the structure illustrated in FIG. 2, since both the insertion layers are provided, the larger magnetoresistance ratio at room temperature is obtained in comparison to that when one insertion layer is provided. As described above, even though the type of the nonmagnetic material, or the material or the thickness of the insertion layer is changed, the effect of increasing the MR ratio is obtained. The thickness of each of the third insertion layer 40C and the fourth insertion layer 60C is preferably equal to or greater than 1 nm. The reason is considered as follows. Since the third insertion layer and the fourth insertion layer have a thickness of 1 nm or greater, it is possible to effectively realize a favorable lattice matching property with the ferromagnetic layer (first ferromagnetic layer 4 or second ferromagnetic layer 6). As a result, the electronic band becomes stable easier than that when the Heusler alloy which has a single layer and does not have the insertion layer is used. Thus, the temperature dependence is improved and the magnetoresistance ratio at room temperature increases.

In a case where the above-described ferromagnetic layer is made of the Heusler alloy, it is considered that spin polarizability is high and the MR ratio is high. If at least any one of the first ferromagnetic layer and the second ferromagnetic layer is made of a ferromagnetic material including the Heusler alloy, the effect of increasing the MR ratio is obtained.

In Example 9 to Example 13, the magnetoresistive effect element includes the first ferromagnetic layer 4 as the fixed magnetization layer, the second ferromagnetic layer 6 as the free magnetization layer, and the nonmagnetic spacer layer (nonmagnetic material 5B) provided between the first ferromagnetic layer and the second ferromagnetic layer. At least one of the first ferromagnetic layer 4 and the second ferromagnetic layer 6 includes the first Heusler layer 60A in contact with the nonmagnetic spacer layer and the second Heusler layer 60B which is in contact with the first Heusler layer 60A and has a composition different from that of the first Heusler layer 60A. Since the first Heusler layer and the second Heusler layer have a similar structure by using two kinds of Heusler layers, the electronic band of the ferromagnetic layer becomes stable. Thus, the temperature dependence is improved and the magnetoresistance ratio at room temperature increases (all temperatures in the above experiments are room temperature). In Example 9 to Example 13, the first Heusler layer constituting the Heusler alloy is made of $Co_2FeSi$, and the second Heusler layer is made of $Co_2MnSi$, and thus it is possible to obtain a high MR ratio. In addition, the following is considered. If any two or more are selected from other Heusler alloys, in particular, $Co_2MnSi$, $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGaSn$, $Co_2FeGeGa$, $Co_2MnGeGa$, $Co_2FeGaSi$, $Co_2FeGeSi$, $Co_2CrSn$, $Co_2CrSn$, and the like as Co-based Heusler alloys, and the selected substances are stacked, the electronic band of the ferromagnetic layer becomes stable and the MR ratio increases, from structural similarity.

In Example 2, Example 6, and Example 11 which are described above, at least one metal element of Ag, Au, Cu, Cr, V, Al, W, and Pt is provided for the nonmagnetic spacer layer. In any case, the increase of the MR ratio is observed.

In Example 3, Example 7, and Example 12, regarding the nonmagnetic spacer layer (nonmagnetic material 5B), MgO, $Al_2O_3$, $TiO_2$, or $HfO_2$ forms the tunnel barrier having the spinel structure. In a case using any material thereof, the high MR ratio is obtained. In Example 4, Example 8, and Example 13, regarding the nonmagnetic spacer layer (nonmagnetic material 5B), the tunnel barrier having the spinel structure is made of any one of $MgAl_2O_4$, $ZnAl_2O_4$, $\gamma\text{-}Al_2O_3$, and $MgGa_2O_4$, and the increase of the MR ratio is observed. It is considered that the effect is based on the coherent tunnel effect. Thus, it is considered that, even though a mixed crystal structure in which one of $MgAl_2O_4$, $ZnAl_2O_4$, $\gamma\text{-}Al_2O_3$, and $MgGa_2O_4$ is provided as the main component is provided, the effect of increasing the MR ratio is exhibited.

What is claimed is:

1. A magnetoresistive effect element comprising:
    a first ferromagnetic layer as a fixed magnetization layer;
    a second ferromagnetic layer as a free magnetization layer; and
    a nonmagnetic spacer layer provided between the first ferromagnetic layer and the second ferromagnetic layer,
    wherein the nonmagnetic spacer layer includes at least one of a first insertion layer provided under the nonmagnetic spacer layer and a second insertion layer provided over the nonmagnetic spacer layer, and
    the first insertion layer and the second insertion layer are made of $Fe_2TiSi$.

2. The magnetoresistive effect element according to claim 1,
    wherein a thickness of each of the first insertion layer and the second insertion layer is equal to or smaller than 3 nm.

3. The magnetoresistive effect element according to claim 1,
    wherein at least one of the first ferromagnetic layer and the second ferromagnetic layer is made of a ferromagnetic material including a Heusler alloy.

4. The magnetoresistive effect element according to claim 1,
    wherein the nonmagnetic spacer layer includes at least one metal element of Ag, Au, Cu, Cr, V, Al, W, and Pt.

5. The magnetoresistive effect element according to claim 1,
    wherein the nonmagnetic spacer layer is made of MgO, $Al_2O_3$, $TiO_2$, or $HfO_2$, or is a tunnel barrier having a spinel structure.

6. The magnetoresistive effect element according to claim 5,
    wherein the tunnel barrier having the spinel structure is made of any one of $MgAl_2O_4$, $ZnAl_2O_4$, $\gamma\text{-}Al_2O_3$, and $MgGa_2O_4$, or has a mixed crystal structure in which one of $MgAl_2O_4$, $ZnAl_2O_4$, $\gamma\text{-}Al_2O_3$, and $MgGa_2O_4$ is provided as a main component.

7. A magnetic head comprising:
    the magnetoresistive effect element according to claim 1.

8. A sensor comprising:
    the magnetoresistive effect element according to claim 1.

9. A high frequency filter comprising:
    the magnetoresistive effect element according to claim 1.

10. An oscillation element comprising:
    the magnetoresistive effect element according to claim 1.

* * * * *